United States Patent
Goh et al.

(10) Patent No.: US 12,210,694 B1
(45) Date of Patent: Jan. 28, 2025

(54) SYSTEM AND METHOD FOR A MOUSE WITH MAGNETIC SCROLL WHEEL

(71) Applicant: Dell Products, LP, Round Rock, TX (US)

(72) Inventors: Peng Lip Goh, Singapore (SG); Weijong Sheu, Austin, TX (US); Deeder M. Aurongzeb, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 0 days.

(21) Appl. No.: 18/386,116

(22) Filed: Nov. 1, 2023

(51) Int. Cl.
*G06F 3/0362* (2013.01)
*G06F 3/01* (2006.01)
*G06F 3/0354* (2013.01)
*H01F 7/02* (2006.01)
*H01H 36/00* (2006.01)
*H03K 17/97* (2006.01)

(52) U.S. Cl.
CPC ............ *G06F 3/0362* (2013.01); *G06F 3/016* (2013.01); *G06F 3/03543* (2013.01); *H01F 7/0273* (2013.01); *H01H 36/004* (2013.01); *H03K 17/97* (2013.01); *H03K 2217/96062* (2013.01)

(58) Field of Classification Search
CPC ........ G06F 3/016; G06F 3/033; G06F 3/0354; G06F 3/03543; G06F 3/03544; G06F 3/0362; H01F 7/0273; H01H 36/004; H03K 17/97; H03K 2217/96062
See application file for complete search history.

(56) References Cited

U.S. PATENT DOCUMENTS

| | | | |
|---|---|---|---|
| 6,717,573 B1 | 4/2004 | Shahoian |
| RE40,808 E | 6/2009 | Shahoian |
| 9,778,760 B1 | 10/2017 | Huang |
| 10,444,872 B2 | 10/2019 | Hsueh |
| 10,726,984 B2 | 7/2020 | Keltz |
| 11,009,973 B1 | 5/2021 | Goh |
| 11,775,091 B2 | 10/2023 | Battlogg |
| 2004/0183782 A1 | 9/2004 | Shahoian |
| 2006/0001657 A1 | 1/2006 | Monney |
| 2006/0109246 A1 | 5/2006 | Lee |
| 2007/0188453 A1 | 8/2007 | O'Sullivan |
| 2009/0079693 A1 | 3/2009 | Monney |
| 2009/0079711 A1 | 3/2009 | Monney |
| 2009/0096750 A1 | 4/2009 | Lee |

(Continued)

*Primary Examiner* — Nathan Danielsen
(74) *Attorney, Agent, or Firm* — Prol Intellectual Property Law, PLLC; H. Kenneth Prol

(57) ABSTRACT

A mouse having a mouse magnetic scroll wheel device operatively couplable to an information handling system comprising a mouse microcontroller, a mouse power management unit, and an encoder where the mouse magnetic scroll wheel device includes a scroll wheel with a scroll wheel outer surface, an axle, and a hollowed out core portion of a scroll wheel structure and the axle is operatively coupled to the encoder to record scrolling input from a user. A cradle to receive the scroll wheel such that the scroll wheel is rotatable in the cradle. The scroll wheel has a scroll wheel metal gear and a scroll wheel permanent magnet disposed in the hollowed out core portion where magnetic interaction of the teeth of the scroll wheel metal gear and the permanent magnet as the scroll wheel rotates generates a magnetic haptic feedback for the scroll wheel.

20 Claims, 9 Drawing Sheets

(56) References Cited

U.S. PATENT DOCUMENTS

| | | |
|---|---|---|
| 2016/0041633 A1 | 2/2016 | Weng |
| 2016/0180820 A1 | 6/2016 | Pascucci |
| 2016/0282969 A1 | 9/2016 | Young |
| 2018/0096570 A1* | 4/2018 | Khoshkava ............ H01F 13/003 |
| 2018/0210562 A1* | 7/2018 | Kao ....................... G06F 3/0362 |
| 2020/0004352 A1* | 1/2020 | McLoughlin ........ G06F 3/03543 |
| 2020/0005977 A1* | 1/2020 | Keltz .................... G06F 3/0362 |
| 2021/0286448 A1 | 9/2021 | Dunant |
| 2022/0300026 A1* | 9/2022 | Alzingre ............... G06F 3/0362 |
| 2023/0016811 A1 | 1/2023 | Dunant |
| 2023/0341956 A1 | 10/2023 | Rizvi |

\* cited by examiner

US 12,210,694 B1

SYSTEM AND METHOD FOR A MOUSE WITH MAGNETIC SCROLL WHEEL

FIELD OF THE DISCLOSURE

The present disclosure generally relates to a mouse pointing device. The present disclosure more specifically relates to a wired or wireless mouse for use with an information handling system that includes a magnetic scroll wheel with magnetic devices for haptics and scroll wheel control.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The information handling system may be used to execute instructions of one or more gaming applications. Further, the information handling system may include any number of peripheral devices including a wired or wireless mouse used to provide input to and receive output from the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
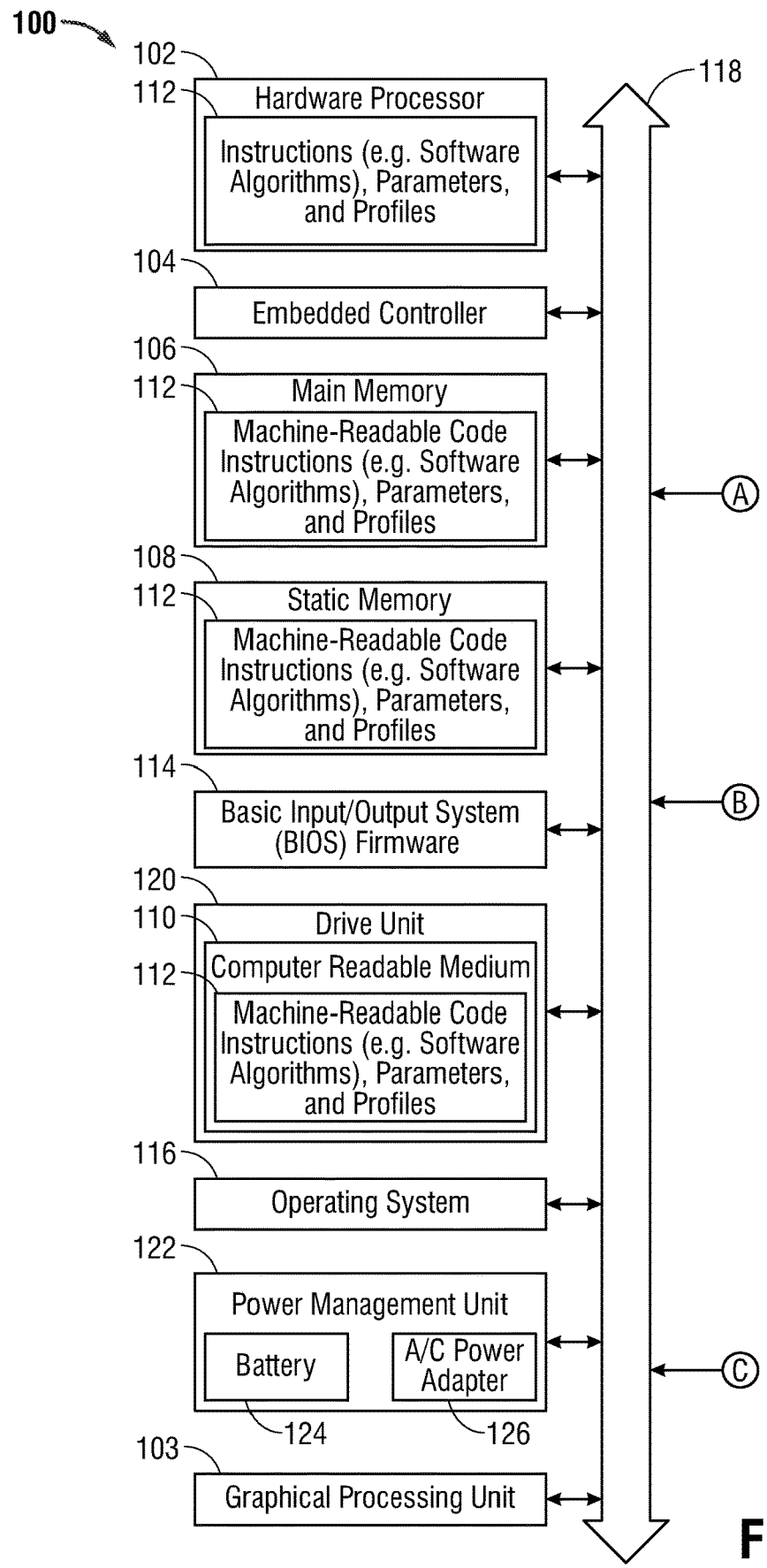
FIG. 1 is a block diagram illustrating an information handling system and a wireless mouse with a magnetic scroll wheel device according to an embodiment of the present disclosure.
Figure 1:
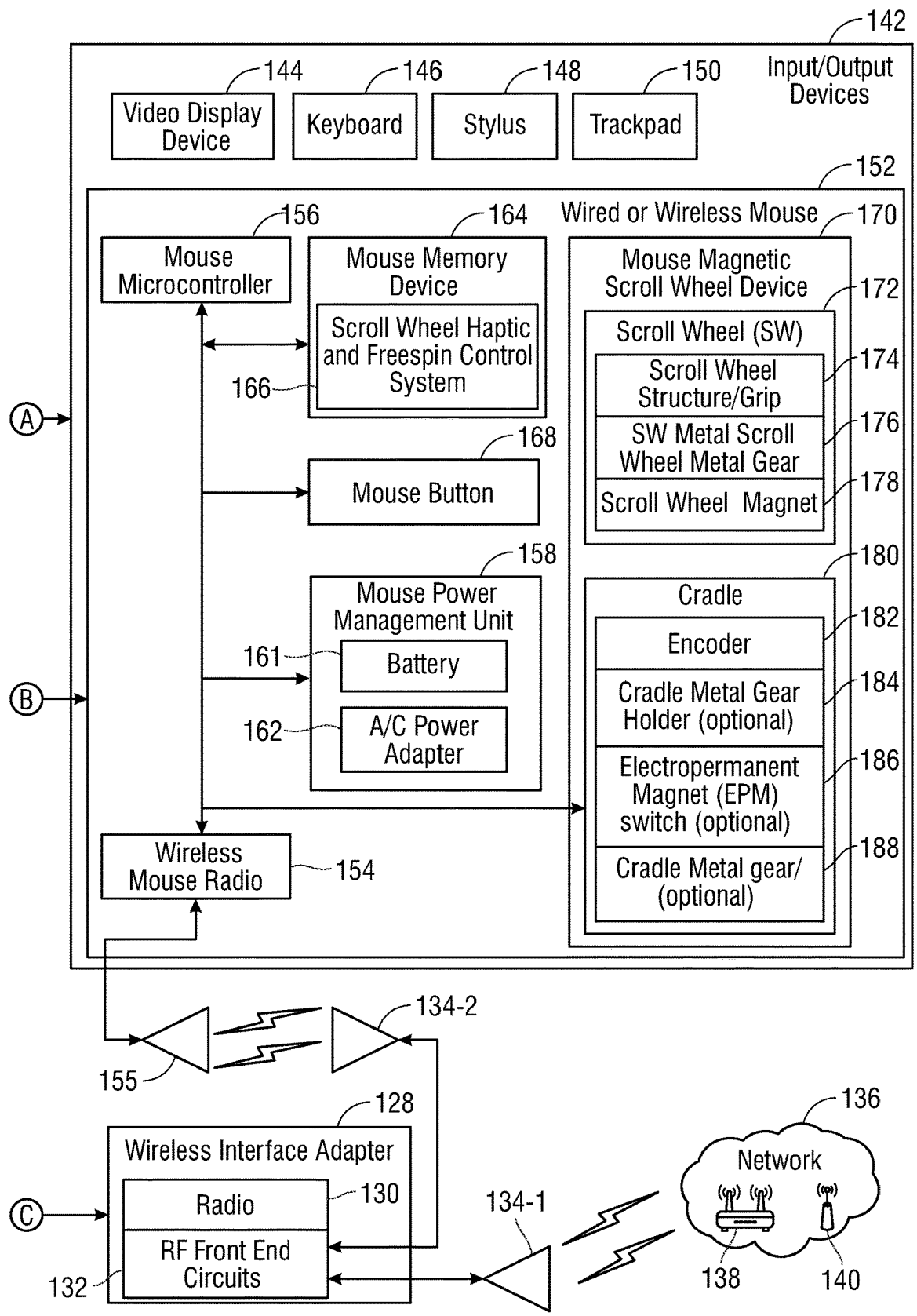

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems include input/output I/O devices that allow a user to interface with the information handling system. Some of these I/O devices may be wireless I/O devices that transceive data to and from the wireless I/O device. Specifically, a wired or wireless mouse may communicate cursor movement, mouse button actuation data, or scroll wheel actuation data to the information handling system as the user actuates mouse movement, a scroll wheel, or one or more mouse buttons of the wired or wireless mouse. However, because the scroll wheel of a wired or wireless mouse utilizes a mechanical encoder and mechanical wheel tactile feedback mechanism, the scroll wheel scrolling may be noisy from such a mechanical encoder and haptic feedback mechanism. Further, for users who prefer a mouse scroll wheel with super high-speed scrolling capability, this either requires a bulky motor to trigger switching to such a high-speed scrolling mode or it is not available for a scroll wheel with a mechanical encoder and feedback mechanism. Such systems may be expensive or cause the mouse to be bulky or heavy.

The present specification describes a wired or wireless mouse operatively coupled to an information handling system that includes a mouse microcontroller and a mouse power management unit (PMU) to provide power to the mouse microcontroller and the mouse PMU operatively coupled to a battery or a power source via wire. The mouse further includes a mouse magnetic scroll wheel device operatively coupled to the mouse microcontroller and PMU for operating as a haptic feedback mechanism. The magnetic scroll wheel device may provide haptic feedback during scrolling via magnetic interaction of a magnet and metal gear embedded in a hollowed out core portion of the scroll wheel or scroll wheel cradle in various embodiments. Further, in some embodiments, an electropermanent magnet (EPM) switch may provide movement of a metal gear wheel or permanent magnet to magnetically engage or disengage the two and engage or disengage the haptic feedback. This EPM switch system may provide for auto-switching or seamless switching between scrolling with a haptic feedback mode at lower scrolling speeds and a high-speed freespin scrolling mode for fast scrolling speeds of the scroll wheel in some embodiments herein.

A scroll wheel haptic and freespin control system may, when executed by the wireless mouse microcontroller, determine when scroll wheel input has reached a threshold speed level. The scroll wheel haptic and freespin control system may also determine, based on scroll speed such as determined from the encoder of the scroll wheel, when to switch the EPM switch system to auto switch between haptic feedback and freespin scrolling in some embodiments. In an embodiment, the scroll wheel haptic and freespin control system, when executed by the wireless mouse microcontroller, determines when a threshold speed of scrolling has reduced again to automatically switch the EPM switch device and reengage the magnetic haptic feedback in other embodiments. This allows the wired or wireless mouse to dynamically switch from operating with a scrolling haptic feedback mode to a freespin scrolling mode or high-speed scrolling mode and back again automatically providing an additional feature for the user.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP) 138, a base station transceiver 140, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In an embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or plural sets, of instructions to perform one or more computer functions.

The information handling system 100 may include main memory 106, (volatile (e.g., random-access memory, etc.), or static memory 108, nonvolatile (read-only memory, flash memory etc.) or any combination thereof), one or more hardware processing resources, such as a hardware processor 102 that may be a central processing unit (CPU), a graphics processing unit (GPU) 103, embedded controller (EC) 104, or any combination thereof. Additional components of the information handling system 100 may include one or more storage devices such as static memory 108 or drive unit 120. The information handling system 100 may include or interface with one or more communications ports for communicating with external devices, as well as various input and output (I/O) devices 142, such as a wired or wireless mouse 152 described in embodiments herein, a trackpad 150, a keyboard 146, a stylus 148, a video/graphics display device 144, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 112 that may operate on servers or systems, remote data centers, or on-box in individual client information handling systems according to various embodiments herein. In some embodiments, it is understood any or all portions of instructions (e.g., software algorithms), parameters, and profiles 112 may operate on a plurality of information handling systems 100.

The information handling system 100 may include the hardware processor 102 such as a central processing unit (CPU). Any of the processing resources may operate to execute code that is either firmware or software code. Moreover, the information handling system 100 may include memory such as main memory 106, static memory 108, and disk drive unit 120 (volatile (e.g., random-access memory, etc.), nonvolatile memory (read-only memory, flash memory etc.) or any combination thereof or other memory with computer readable medium 110 storing instructions (e.g., software algorithms), parameters, and profiles 112 executable by the EC 104, hardware processor 102, GPU 103, or any other processing device. The information handling system 100 may also include one or more buses 118 operable to transmit communications between the various hardware components such as any combination of various I/O devices 142 as well as between hardware processors 102, an EC 104, the operating system (OS) 116, the basic input/output system (BIOS) 114, the wireless interface adapter 128, or a radio module, among other components described herein. In an embodiment, the information handling system 100 may be in wired or wireless communication with the I/O devices 142 such as a keyboard 146, a wired or wireless mouse 152, video display device 144, stylus 148, or trackpad 150 among other peripheral devices.

The information handling system 100 further includes a video/graphics display device 144. The video/graphics display device 144 in an embodiment may function as a liquid crystal display (LCD), an organic light emitting diode (OLED), a flat panel display, or a solid-state display. Additionally, as described herein, the information handling system 100 may include one or more other I/O devices 142 including the wired or wireless mouse 152 described herein that allows the user to interface with the information handling system 100 via the video/graphics display device 144, a cursor control device (e.g., a trackpad 150, or gesture or touch screen input), a stylus 148, and/or a keyboard 146, among others. Various drivers and control electronics may be operatively coupled to operate the I/O devices 142 according to the embodiments described herein. The present specification contemplates that the I/O devices 142 may be wired or wireless. In the context of the wired or wireless mouse 152 described herein, the wired or wireless mouse 152 in a wireless version is operatively coupled to the information handling system 100 via a wireless connection using a wireless mouse radio 154 and wireless mouse antenna 176.

A network interface device of the information handling system 100 shown as wireless interface adapter 128 can provide connectivity among devices such as with Bluetooth® or to a network 136, e.g., a wide area network (WAN), a local area network (LAN), wireless local area network (WLAN), a wireless personal area network (WPAN), a wireless wide area network (WWAN), or other network. In embodiments described herein, the wireless interface device 128 with its radio 130, RF front end 132 and antenna 134-2 is used to communicate with the wireless version of mouse 152 via, for example, a Bluetooth® or Bluetooth® Low Energy (BLE) protocols at 2.4 GHz, 6 GHz, or other frequencies. In an embodiment, the WAN, WWAN, LAN, and WLAN may each include an AP 138 or base station 140 used to operatively couple the information handling system 100 to a network 136. In a specific embodiment, the network 136 may include macro-cellular connections via one or more base stations 140 or a wireless AP 138 (e.g., Wi-Fi), or such as through licensed or unlicensed WWAN small cell base stations 140. Connectivity may be via wired or wireless connection. For example, wireless network wireless APs 138 or base stations 140 may be operatively connected to the information handling system 100. Wireless interface adapter 128 may include one or more radio frequency (RF) subsystems (e.g., radio 130) with transmitter/receiver circuitry, modem circuitry, one or more antenna radio frequency (RF) front end circuits 132, one or more wireless controller circuits, amplifiers, antennas 134-1, 134-2 and other circuitry of the radio 130 such as one or more antenna ports used for wireless communications via multiple radio access technologies (RATs). The radio 130 may communicate with one or more wireless technology protocols.

In an embodiment, the wireless interface adapter 128 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 128 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums. The wireless interface adapter 128 can represent an add-in card, wireless network interface module that is integrated with a main board of the information handling system 100 or integrated with another wireless network interface capability, or any combination thereof.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 112 or receives and executes instructions, parameters, and profiles 112 responsive to a propagated signal, so that a device connected to a network 136 may communicate voice, video, or data over the network 136. Further, the instructions 112 may be transmitted or received over the network 136 via the network interface device or wireless interface adapter 128.

The information handling system 100 may include a set of instructions 112 that may be executed to cause the computer system to perform any one or more of the methods or computer-based functions disclosed herein. For example, instructions 112 may be executed by a hardware processor 102, GPU 103, EC 104 or any other hardware processing resource and may include software agents, or other aspects or components used to execute the methods and systems described herein. Various software modules comprising application instructions 112 may be coordinated by an OS 116, and/or via an application programming interface (API). An example OS 116 may include Windows®, Android®, and other OS types. Example APIs may include Win 32, Core Java API, or Android APIs.

In an embodiment, the information handling system 100 may include a disk drive unit 120. The disk drive unit 120 and may include machine-readable code instructions, parameters, and profiles 112 in which one or more sets of machine-readable code instructions, parameters, and profiles 112 such as firmware or software can be embedded to be executed by the hardware processor 102 or other hardware processing devices such as a GPU 103 or EC 104, or other microcontroller unit to perform the processes described herein. Similarly, main memory 106 and static memory 108 may also contain a computer-readable medium for storage of one or more sets of machine-readable code instructions, parameters, or profiles 112 described herein. The disk drive unit 120 or static memory 108 also contain space for data storage. Further, the machine-readable code instructions, parameters, and profiles 112 may embody one or more of the methods as described herein. In a particular embodiment, the machine-readable code instructions, parameters, and profiles 112 may reside completely, or at least partially, within the main memory 106, the static memory 108, and/or within the disk drive 120 during execution by the hardware processor 102, EC 104, or GPU 103 of information handling system 100.

Main memory 106 or other memory of the embodiments described herein may contain computer-readable medium (not shown), such as RAM in an example embodiment. An example of main memory 106 includes random access memory (RAM) such as static RAM (SRAM), dynamic RAM (DRAM), non-volatile RAM (NV-RAM), or the like, read only memory (ROM), another type of memory, or a combination thereof. Static memory 108 may contain computer-readable medium (not shown), such as NOR or NAND flash memory in some example embodiments. The applications and associated APIs, for example, may be stored in static memory 108 or on the disk drive unit 120 that may include access to a machine-readable code instructions, parameters, and profiles 112 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 122 (a.k.a. a power supply unit (PSU)). The PMU 122 may include a hardware controller and executable machine-readable code instructions to manage the power provided to the components of the information handling system 100 such as the hardware processor 102 and other hardware components described herein. The PMU 122 may control power to one or more components including the one or more drive units 120, the hardware processor 102 (e.g., CPU), the EC 104, the GPU 103, a video/graphic display device 144, or other wired I/O devices 142 such as the wired version of mouse 152, the stylus 148, a keyboard 146, and a trackpad 150 and other components that may require power when a power button has been actuated by a user. In an embodiment, the PMU 122 may monitor power levels and be electrically coupled to the information handling system 100 to provide this power. The PMU 122 may be coupled to the bus 118 to provide or receive data or machine-readable code instructions. The PMU 122 may regulate power from a power source such as the battery 124 or AC power adapter 126. In an embodiment, the battery 124 may be charged via the AC power adapter 126 and provide power to the components of the information handling system 100, via wired connections as applicable, or when AC power from the AC power adapter 126 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium 110 can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

As described herein, the information handling system is operatively coupled to a wired or wireless mouse 152. The wired or wireless mouse 152 may be used by a user to provide input to the information handling system 100 in the form cursor movement from movement of the wired or wireless mouse 152 by the user and detected by a movement tracking sensor such as an LED optical sensor of mouse movement. Wired or wireless mouse 152 may be used by a user to select data via actuation of a wireless mouse button on the mouse in another aspect. Further, wired or wireless mouse 152 may be used by a user to navigate data via scroll input using a mouse magnetic scroll wheel device 170 according to embodiments herein. As described herein, the wireless version of mouse 152 includes a wireless mouse radio 154 and wireless mouse antenna 155 that is used to communicate with the information handling system 100. A wired version of mouse 152 may communicate with the information handling system 100 via a wired connection such as a universal serial bus (USB) connection with a network interface adapter and bus 118. In embodiments herein, information handling system 100 executes a wireless mouse driver that allows the communication between the information handling system 100 and the wired or wireless mouse 152.

The wired or wireless mouse 152 further includes a mouse microcontroller 156. The wireless mouse microcontroller 156 may be any type of processing device that is capable of executing the machine-readable code instructions (e.g., firmware or software algorithms), parameters, and profiles such as the scroll wheel haptic and freespin control system 166 described herein. The computer readable program code of the scroll wheel haptic and freespin control system 166 may be accessed by the mouse microcontroller 156 at a memory device 164 operatively coupled to the mouse microcontroller 156. The mouse microcontroller 156 may also receive input from, for example, an encoder 182 used to determine scroll speed and EPM switch 186 used to determine status in a haptic feedback scroll mode or a freespin scroll mode for determining whether the EPM switch 186 should be switched between these modes.

The wired or wireless mouse 152 further includes a mouse memory device 164. The mouse memory device 164 may be used to store computer readable code of the scroll wheel haptic and freespin control system 166 as well as any data used by the mouse microcontroller 156 to execute the systems and methods described herein.

The wired or wireless mouse 152 also includes a mouse PMU 158. The mouse PMU 158 may include a hardware controller and executable machine-readable code instructions to manage the power provided to the components of the wired or wireless mouse 152 such as the mouse microcontroller 156, encoder 182, the EPM switch 186, the mouse memory device 164, and other hardware components described herein. In an embodiment, the mouse PMU 158 may monitor power levels and be electrically coupled within the wired or wireless mouse 152 to provide this power.

The wired or wireless mouse 152 further includes a mouse magnetic scroll wheel device 170 which may include a scroll wheel 172 which is a circular metallic or plastic outer structure of a wheel shape with a scroll wheel structure/grip 174 that includes grip surface or touch surface on an outer surface of the scroll wheel 172. The scroll wheel 172 may include a formed wheel axle or axle receiver in the center of the wheel structure for setting the scroll wheel 172 into a cradle 180 of the mouse magnetic scroll wheel device 170 to permit the scroll wheel 172 to spin when scrolled. Around the axle or axle receiver center of the scroll wheel 172 and embedded into a hollowed-out core portion of the scroll wheel 172 inside the perimeter of the wheel are included at least a scroll wheel metal gear 176 and plural scroll wheel metal gears depending on the embodiment. Additionally, around the axle or axle receiver center of the scroll wheel 172 and embedded into a hollowed-out portion of the scroll wheel 172 inside the perimeter of the wheel are included at least a scroll wheel magnet 178, such as a permanent magnet in embodiments herein. The axle of the scroll wheel 172 may be operatively coupled to spin within the cradle 180 of the mouse magnetic scroll wheel device 170. Cradle 180 may include an encoder 182, such as a hall sensor encoder and encoding printed circuit board in an example embodiment, to detect a spinning axle hall sensor magnet to detect the scroll motion of the scroll wheel 172.

In one embodiment, where the mouse magnetic scroll wheel device 170 has a capability to switch between a haptic feedback scroll mode or a freespin scroll mode, the cradle may include an electropermanent magnet (EPM) switch 186. The EPM switch 186 may be disposed at the cradle and partially disposed within the hollowed-out core portion of the scroll wheel structure/grip 174 to receive a pulse of current or voltage from the mouse PMU 158 upon instruction from a scroll wheel haptic and freespin control system 166 executing on a mouse microcontroller 156 according to embodiments herein. This pulse of current or voltage may switch polarity of the EPM switch 186, but does not require continuous voltage or current to maintain either polarity. The pulse of current switching polarity of the EPM switch 186 disposed partially within the hollowed-out core portion of the scroll wheel 172 will cause the scroll wheel permanent magnet 178 disposed therein to be attracted or repelled from the EPM of the EPM switch 186. If the polarities are aligned to be the same such that the scroll wheel permanent magnet is repelled by the EPM switch 186, the scroll wheel permanent magnet 178 will be urged outward in the diameter of the hollowed-out portion of the scroll wheel 172. For example, the scroll wheel permanent magnet 178 may be operatively coupled to a limited sliding track to allow the scroll wheel permanent magnet 178 to slide laterally outward or inward in the hollowed-out core portion of the scroll wheel 172 relative to the scroll wheel axle depending on the polarity of the EPM switch 186. Accordingly, a second pulse of current or voltage from the mouse PMU 158 will switch the polarity of the EPM switch 186 causing the scroll wheel permanent magnet 178 to retract toward the center scroll wheel axle in another embodiment.

When the scroll wheel permanent magnet 178 is repelled outward in the diameter of the core of the hollowed-out portion of the scroll wheel 172, the scroll wheel permanent magnet 178 is moved closer to a scroll wheel metal gear 176. Scroll wheel metal gear in this embodiment is an internal scroll wheel metal gear 176 disposed on an inner surface of the hollowed-out core cavity of the scroll wheel 172 with gear teeth disposed inward toward the axle. The scroll wheel metal gear 176 is made of a ferromagnetic material in some embodiments. With the metal teeth of the internal scroll wheel metal gear 176 pointing inward, when the scroll wheel permanent magnet 178 is urged outward, the scroll wheel permanent magnet 178 will be moved close enough to magnetically interact with the internal scroll wheel metal gear 176. The scroll wheel permanent magnet 178 in such an embodiment may have prongs or teeth-like extensions to further enhance the magnetic interaction with the internal gear teeth. This interaction with the teeth of the internal scroll wheel metal gear 176 generates a magnetically generated haptic feel of the scroll wheel spinning. The scroll wheel permanent magnet 178 in an embodiment including one or more teeth-like extensions so that a pointed magnetic interaction may occur between the scroll wheel permanent magnet 178 in an outward position and the teeth of the internal scroll wheel metal gear 176 rotating in the outside of the core of the hollowed-out portion of the scroll wheel 172. In such an embodiment, the mouse magnetic scroll wheel device 170 may operate in haptic feedback scroll mode.

To switch from the haptic feedback scroll mode to a freespin scroll mode, a pulse of current or voltage will switch the polarity of the EPM switch 186 retracts the scroll wheel permanent magnet 178. In the inward position, when the EPM switch 186 attracts the scroll wheel permanent magnet 178 it is retracted inward towards the center axle of the mouse magnetic scroll wheel device 170. With this retraction, the scroll wheel permanent magnet 178 is moved away from the internal scroll wheel metal gear 176 and its ferromagnetic teeth. This ceases the magnetic interaction between the internal scroll wheel metal gear 176 and the teeth-like extensions of the scroll wheel permanent magnet 178 allowing the scroll wheel 172 to spin freely in the cradle 180 in an embodiment. Thus, the mouse microcontroller 156 receive data on the speed of the scroll wheel spin detected by the encoder 182. When the mouse microcontroller 156 reaches a threshold scrolling rotation speed, the mouse microcontroller 156 determines that a faster scrolling function is desired to scroll at the information handling system 100 more quickly. In this way, the mouse microcontroller 156 executes the scroll wheel haptic and freespin control system 166 to switch the mouse magnetic scroll wheel device 170 to a freespin scroll mode when scroll wheel spin meets a threshold scrolling speed according to embodiments herein.

In another embodiment, the mouse magnetic scroll wheel device 170 may utilize a different magnetic haptic device structure to generate haptics. The mouse magnetic scroll wheel device 170 of such a second embodiment may include a scroll wheel permanent magnet 178 and a scroll wheel metal gear 176 installed around an axle and nested in the core of a hollowed-out portion of the scroll wheel 172 to form a built-in magnetic haptic feedback system. The scroll wheel permanent magnet 178 and the scroll wheel metal gear 176 are affixed to the spinning structure of the scroll wheel 172 in its core hollowed out portion. The scroll wheel permanent magnet 178 and the scroll wheel metal gear 176 spin in the cradle 180 of the mouse magnetic scroll wheel device 170 with the scroll wheel 172. A second portion of the built-in magnetic haptic feedback system in the mouse magnetic scroll wheel device 170 is operatively coupled to the axle of the scroll wheel 172 but does not spin with the axle or the scroll wheel 172 in the second embodiment. A cradle gear holder 184 is formed to hold the teeth of a cradle metal gear 188 in an embodiment. The cradle gear holder 184 and cradle metal gear 188 are formed or installed on the axle and inserted into the core of the hollowed-out portion of the scroll wheel 172. The cradle gear holder 184 includes an outer notch or ridge to prevent the cradle gear holder 184 from rotating and prevent the cradle metal gear 188 from rotating. The cradle metal gear 188 is placed in the cradle gear holder 184 around the axle of the scroll wheel 172 but does not spin. The scroll wheel metal gear 176 spin adjacent to the fixed cradle metal gear 188 is placed in the cradle gear holder 184 when the scroll wheel 172 spins in cradle 180 in this embodiment. The notch or ridge of the cradle gear holder 184 sits on or is held by the housing of the cradle 180 in such an embodiment.

The scroll wheel permanent magnet 178 magnetizes the scroll wheel metal gear 176 which is made of a ferromagnetic material in the second embodiment of the mouse magnetic scroll wheel device 170. The fixed cradle metal gear 188 is also made of a ferromagnetic material, such that some magnetic attraction occurs between the cradle metal gear 188 when it is adjacent to the rotating, magnetized scroll wheel metal gear 176. As the scroll wheel spins for scrolling, the scroll wheel permanent magnet 178 and the scroll wheel metal gear 176 also rotate. The magnetized scroll wheel metal gear 176 next to the scroll wheel permanent magnet 178 rotates on the axle next to the fixed cradle metal gear 188 that is fixed from rotating by the cradle gear holder 184. As teeth of the magnetized scroll wheel metal gear 176 align with the teeth of cradle metal gear 188 during rotation, a greater amount of the ferromagnetic material for the cradle metal gear 188 aligns with the magnetized scroll wheel metal gear 176. When this alignment of teeth happens, the magnetic attraction between the cradle metal gear 188 and the magnetized scroll wheel metal gear 176 increases. When the teeth are not aligned, such as when the teeth of the rotating magnetized scroll wheel metal gear 176 are offset from the cradle metal gear 188 and instead aligns with the plastic holders of the cradle metal gear holder 184, the magnetic attraction is lessened. This alternating levels of magnetic attraction between the rotating scroll wheel metal gear 176 and the fixed cradle metal gear 188 creates a magnetized haptic feedback in rotation of the scroll wheel 172 in the cradle 180. Further, the axle of the scroll wheel 172 may also have an encoder operatively coupled thereto. In an embodiment, the encoder 182 is a Hall sensor encoder detector that detects a Hall sensor magnet on the axle of the scroll wheel 172 as with embodiments herein.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a standalone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2A:
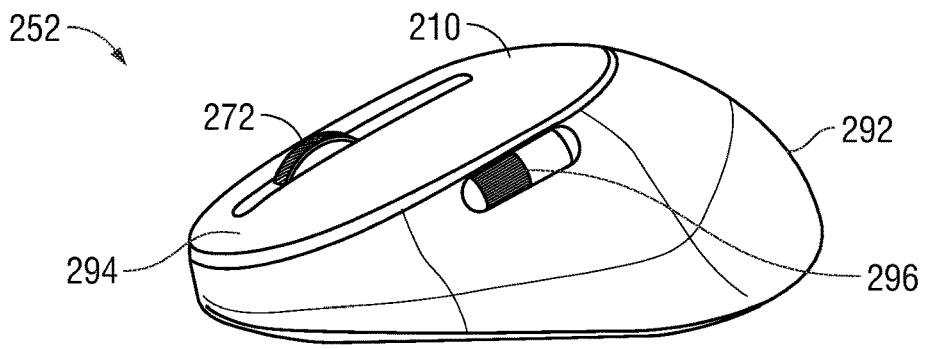
FIG. 2A is a perspective view of a wired or wireless mouse according to an embodiment of the present disclosure.
Figure 2B:
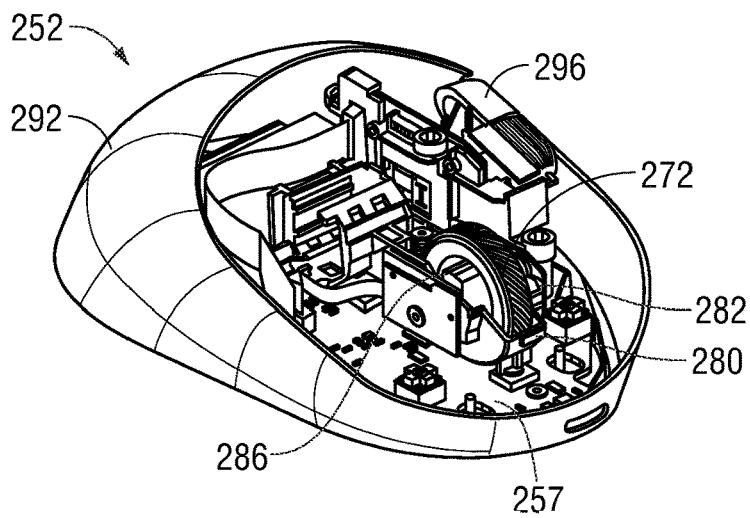
FIG. 2B is a perspective view of a wired or wireless mouse with a top panel removed to show a mouse magnetic scroll wheel device with an embedded magnetic haptic device and an electropermanent magnet (EPM) switch according to an embodiment of the present disclosure.
Figure 2C:
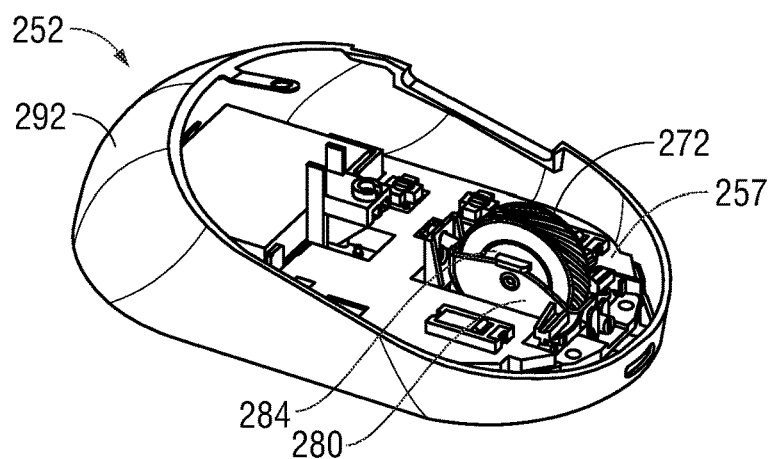
FIG. 2C is a perspective view of a wired or wireless mouse with a top panel removed to show a mouse magnetic scroll wheel device with an embedded magnetic haptic device according to another embodiment of the present disclosure.

FIG. 2A is a perspective view of a wired or wireless mouse 252 according to an embodiment of the present disclosure. Additionally, FIG. 2B is a perspective view of a wired or wireless mouse 252 with a top panel removed to show a mouse magnetic scroll wheel device with an embedded magnetic haptic device and an electropermanent magnet (EPM) switch according to an embodiment of the present disclosure. Still further, FIG. 2C is a perspective view of a wired or wireless mouse 252 with a top panel removed to show mouse magnetic scroll wheel device with an embedded magnetic haptic device according to another embodiment of the present disclosure. FIGS. 2A, 2B, and 2C show embodiments of a wired or wireless mouse 252 that may be operatively couplable to an information handling system (e.g., 100, FIG. 1). In an embodiment, the wireless version of the mouse 252 may include a mouse radio and mouse antenna that wirelessly communicates with the information handling system. The wireless version of the mouse 252 may include a battery operatively coupled to a wireless mouse PMU (not shown) used to supply power to the components of the wireless mouse 252. In an embodiment, a wired mouse 252 may include an electrical cord that extends from a mouse PMU and mouse PCB 257 that may be operatively coupled to an information handling system via, for example, a universal serial bus (USB) port formed in the information handling system. The wired mouse 252 version may be provided power via the electrical cord and mouse PMU.

The wired or wireless mouse 252 may include a top panel 290 that forms a portion of the housing of the wired or wireless mouse 252. In an embodiment, the top panel 290 may have one or more mouse buttons 294 incorporated into the top panel 290. These mouse buttons 294 may be diveboard-type buttons that may be pressed by a user to provide input at the wired or wireless mouse 252 to the information handling system. The top panel 290 may also include a void through which the scroll wheel 272 may extend out of the housing of the wired or wireless mouse 252. In an embodiment, the wired or wireless mouse 252 may further include other buttons or input actuators such as a mouse side button and scroll wheel 296 that may be used to provide additional types of input at the information handling system.

The wired or wireless mouse 252 may also include a base chassis 292. The base chassis 292 may serve as a support structure onto which, for example, the scroll wheel 272, cradle 280, encoder 282, EPM switch, cradle metal gear, and mouse PCB 257 may be supported. In an embodiment, the mouse PCB 257 may include any circuitry that operatively couples these various components together. For example, the mouse PCB 257 may include various circuitry that operatively couples a mouse PMU to a mouse microcontroller formed on the mouse PCB 257. Still further, the mouse PCB 257 may include circuitry that allows the encoder 282 to be operatively coupled to the mouse microcontroller as described herein.

FIG. 2A shows the wired or wireless mouse 252 with the top panel 290 assembled to the remaining housing of the wired or wireless mouse 252 including the base chassis 292. FIGS. 2B and 2C show the top panel 290 removed from the base chassis 292 in order to show the scroll wheel 272 and cradle 280 with an encoder 282 of the mouse magnetic scroll wheel device. FIGS. 2B and 2C shows the scroll wheel 272 used by a user to provide scrolling input to an information handling system.

FIG. 2B shows an embodiment where a mouse magnetic scroll wheel device has a capability to switch between a haptic feedback scroll mode or a freespin scroll mode. In an embodiment, the cradle 280 may include an EPM switch 286 as part of the mouse magnetic scroll wheel device. The EPM switch 286 may be disposed at the cradle 280 and partially disposed within the hollowed-out core portion of the scroll wheel 272. The EPM switch 286 receives a pulse of current or voltage from the mouse PMU (not shown) upon instruction from a scroll wheel haptic and freespin control system (not shown) executing on a mouse microcontroller (not shown) according to embodiments herein. This pulse of current or voltage may switch polarity of the EPM switch 286 but does not require continuous voltage or current to maintain either polarity. The pulse of current switching polarity of the EPM switch 286 disposed partially within the hollowed-out core portion of the scroll wheel 272 will cause the scroll wheel permanent magnet (not shown) disposed therein to be attracted or repelled from the EPM of the EPM switch 286. If the polarities are aligned to be the same such that the scroll wheel permanent magnet is repelled by the EPM switch 286, the scroll wheel permanent magnet will be urged outward in the diameter of the hollowed-out portion of the scroll wheel 272. For example, the scroll wheel permanent magnet may be operatively coupled to a limited sliding track to allow the scroll wheel permanent magnet to slide laterally outward or inward in the hollowed-out core portion of the scroll wheel 272 relative to the scroll wheel axle depending on the polarity of the EPM switch 286. Accordingly, a second pulse of current or voltage from the mouse PMU will switch the polarity of the EPM switch 286 causing the scroll wheel permanent magnet to retract toward the center scroll wheel axle in another embodiment.

When the scroll wheel permanent magnet is repelled outward in the diameter of the core of the hollowed-out portion of the scroll wheel 272, the scroll wheel permanent magnet is moved closer to a scroll wheel metal gear that is an internal scroll wheel metal gear (not shown) disposed on an inner surface of the hollowed-out core cavity of the scroll wheel 272. The scroll wheel metal gear is made of a ferromagnetic material in some embodiments. With the metal teeth of the internal scroll wheel metal gear pointing inward, when the scroll wheel permanent magnet is urged outward, the scroll wheel permanent magnet will be moved close enough to magnetically interact with the internal scroll wheel metal gear. This interaction with the teeth of the internal scroll wheel metal gear generates a magnetically generated haptic feel of the scroll wheel 272 when the user is spinning or rotating the scroll wheel 272. The scroll wheel permanent magnet may include one or more teeth-like extensions so that a pointed magnetic interaction may occur between the scroll wheel permanent magnet in an outward position and the teeth of the internal scroll wheel metal gear in the outside of the core of the hollowed-out portion of the scroll wheel 272. In such an embodiment, the mouse magnetic scroll wheel device may operate in haptic feedback scroll mode.

To switch from the haptic feedback scroll mode to a freespin scroll mode, a pulse of current or voltage will switch the polarity of the EPM switch 286 to retract the scroll wheel permanent magnet. In the inward position, when the EPM switch 286 attracts the scroll wheel permanent magnet to retract it inward towards the center axle of the mouse magnetic scroll wheel device. With this retraction, the scroll wheel permanent magnet is moved away from the internal scroll wheel metal gear and its ferromagnetic teeth. This ceases the magnetic interaction between the internal scroll wheel metal gear and the teeth-like extensions of the scroll wheel permanent magnet allowing the scroll wheel 272 to spin freely in the cradle 280. Thus, the mouse microcontroller will interpret the wheel spin detected by the encoder 282 as a faster or greater scroll function desired to move the scrolling reported to the information handling system more quickly. In this way, the mouse microcontroller executes the scroll wheel haptic and freespin control system to switch the mouse magnetic scroll wheel device to a freespin scroll mode according to embodiments herein. The embodiments shown in FIG. 2B are described in more detail in, for example, the description of FIGS. 3A, 3B, 4A, 4B, and 4C.

FIG. 2C shows another embodiment where the mouse magnetic scroll wheel device utilizes a different magnetic haptic device structure that that shown in FIG. 2B. The mouse magnetic scroll wheel device in FIG. 2C of may include a scroll wheel permanent magnet (not shown) and a scroll wheel metal gear (not shown) installed around an axle and nested in core of a hollowed-out portion of the scroll wheel 272 to form a built-in magnetic haptic feedback system. The scroll wheel permanent magnet and the scroll wheel metal gear are affixed to the spinning structure of the scroll wheel 272 in its core and spin in the cradle 280 with the scroll wheel 272 of this embodiment of the mouse magnetic scroll wheel device. A second portion of the built-in magnetic haptic feedback system is also operatively coupled to the axle of the scroll wheel 272 but does not spin with the axle or the scroll wheel 272 in this embodiment of the mouse magnetic scroll wheel device. This second portion includes a cradle metal gear holder 284 and a cradle metal gear (not shown). The cradle gear holder 284 is formed to hold the teeth of a cradle metal gear in an embodiment. The cradle gear holder 284 and cradle metal gear are formed or installed on the axle and inserted into the core of the hollowed-out portion of the scroll wheel 272. The cradle gear holder 284 includes an outer notch or ridge to prevent the cradle gear holder 284 from rotating and prevent the cradle metal gear from spinning with the axle or the scroll wheel 272 when the scroll wheel 272 is placed in cradle 280. This notch or ridge of the cradle gear holder 284 sits on or is held by the housing of the cradle 280.

The scroll wheel permanent magnet magnetizes the scroll wheel metal gear which is made of a ferromagnetic material. The fixed cradle metal gear is also made of a ferromagnetic material, such that some magnetic attraction occurs between the cradle metal gear that is adjacent to the rotating scroll wheel metal gear. As the scroll wheel 272 spins for scrolling, the scroll wheel permanent magnet and the scroll wheel metal gear also rotate. The magnetized scroll wheel metal gear next to the scroll wheel permanent magnet rotates on the axle next to the cradle metal gear that is fixed from rotating by the cradle gear holder 284. As teeth of the magnetized scroll wheel metal gear align with the teeth of cradle metal gear during rotation, a greater amount of the ferromagnetic material for the cradle metal gear aligns with the magnetized scroll wheel metal gear. When this alignment of teeth happens, the magnetic attraction between the cradle metal gear and the magnetized scroll wheel metal gear increases. When the teeth are not aligned, such as when the teeth of the rotating magnetized scroll wheel metal gear aligns with the plastic holders of the cradle metal gear holder 284 instead of the fixed cradle metal gear teeth, the magnetic attraction is lessened. This alternating levels of magnetic attraction between the rotating scroll wheel metal gear and the fixed cradle metal gear creates a magnetized haptic feedback in rotation of the scroll wheel 272 in the cradle 280 of the mouse magnetic scroll wheel device. Further, the axle of the scroll wheel 272 may also have an encoder 282 operatively coupled thereto. In an embodiment, the encoder 282 is a Hall sensor encoder detector that detects a Hall sensor magnet on the axle of the scroll wheel 272 as with embodiments herein. The embodiments shown in FIG. 2C are described in more detail in, for example, the description of FIGS. 5A through 5D.

Figure 3A:
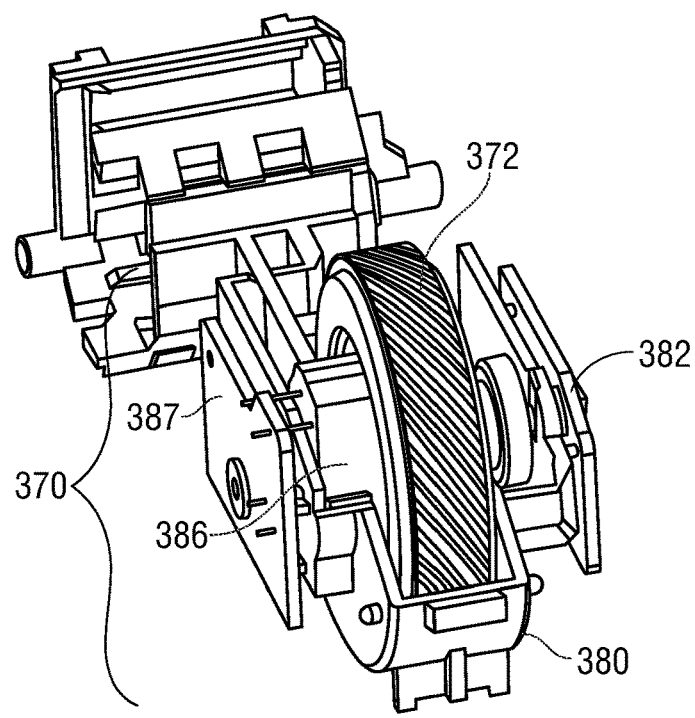
FIG. 3A is a perspective view of a mouse magnetic scroll wheel device with an embedded magnetic haptic device and an EPM switch for a wired or wireless mouse according to an embodiment of the present disclosure.
Figure 3B:
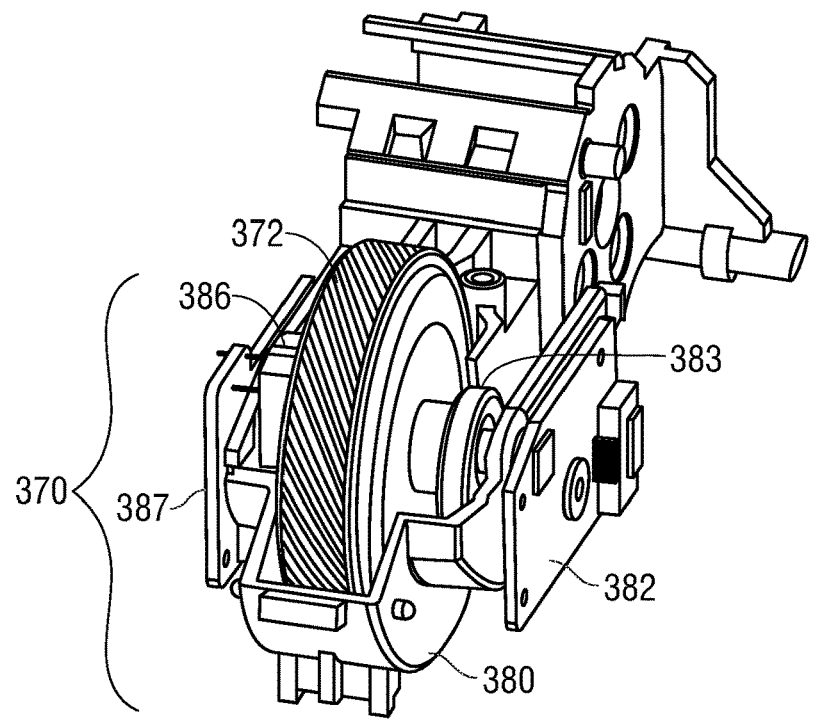
FIG. 3B is another perspective view a mouse magnetic scroll wheel device with an embedded magnetic haptic device and an EPM switch for a wired or wireless mouse according to an embodiment of the present disclosure.

FIG. 3A is a perspective view of a mouse magnetic scroll wheel device with an embedded magnetic haptic device in a scroll wheel and an EPM switch 386 for a wired or wireless mouse according to an embodiment of the present disclosure. Additionally, FIG. 3B is another perspective view of a mouse magnetic scroll wheel device the embedded magnetic haptic device in a scroll wheel and the EPM switch 386 for a wired or wireless mouse according to an embodiment of the present disclosure. As described herein, the mouse magnetic scroll wheel device 370 described in connection with FIGS. 3A and 3B includes embodiments where the mouse magnetic scroll wheel device 370 has a capability to switch between a haptic feedback scroll mode or a freespin scroll mode.

The capability to switch between a haptic feedback scroll mode and a freespin scroll mode is accomplished, in part, through the use of a EPM switch 386 selectively magnetically engaging with a permanent magnet (not shown) formed within the hollowed-out portion of the scroll wheel 372. FIG. 3A shows the EPM switch 386 disposed at the cradle 380 and partially disposed within the hollowed-out core portion of the scroll wheel 372. During operation, the EPM switch 386 receives an electrical pulse of current or voltage from a mouse PMU (not shown). This electrical pulse of current or voltage may be transmitted to the EPM switch 386 via execution of the scroll wheel haptic and freespin control system by the mouse microcontroller and based on input from an encoder 382 formed, in an embodiment, on an opposite side of the scroll wheel 372 as shown in FIG. 3B. When the electrical pulse of current or voltage is received at the EPM switch 386, the polarity of the EPM switch 286 is switched such that the scroll wheel permanent magnet (not shown) disposed therein is attracted to the EPM of the EPM switch 386. In an embodiment, the scroll wheel permanent magnet may be operatively coupled to a limited sliding track that allows the scroll wheel permanent magnet to slide laterally outward or inward in the hollowed-out core portion of the scroll wheel 372 relative to the scroll wheel axle depending on the polarity of the EPM switch 186. When the polarity of the EPM of the EPM switch 386 is switched to attract the permanent magnet, this causes the magnetic interaction between the permanent magnet and the scroll wheel metal gear formed on an interior surface of the hollowed-out portion of the scroll wheel 372 to be reduced or eliminated. This disengagement of the magnetic interaction between the scroll wheel metal gear and the permanent magnet allows the scroll wheel 372 to transition from being operated under a haptic feedback scroll mode to a freespin scroll mode. Indeed, because there is no magnetic interaction between the permanent magnet and the scroll wheel metal gear, the scroll wheel 372 may be rotated freely without haptic feedback being felt by the user. This may be beneficial when the user is attempting to scroll across a large document or website, for example, being presented to the user on a graphical user interface (GUI) at a video display device (e.g., video display device 144, FIG. 1). It is appreciated that the electrical pulse of current or voltage sent to the EPM switch 386 causes the polarity of the EPM to switch into a semi-permanent state such that consistent current or voltage is not necessary to maintain this polarity used to attract the permanent magnet. This reduces the amount of power necessary to maintain the scroll wheel 372 in the freespin scroll mode thereby reducing the carbon footprint associated with replacing batteries (e.g., dry cell or rechargeable batteries) in a wireless version of the mouse or constantly powering mouse via a wired connection in order to maintain this freespin scroll mode.

In an embodiment, a subsequent electrical pulse of current or voltage provided to the EPM switch 386 may switch the polarity of the EPM in the EPM switch 386 such that the permanent magnet is repelled away from the EPM. This causes the permanent magnet to slide laterally away from the axle of the scroll wheel 372 such that the permanent magnet engages or re-engages magnetically with the ferromagnetic material of the scroll wheel metal gear. In an embodiment, the permanent magnet includes one or more teeth-like extensions that are configured to extend toward a tip diameter or addendum circle of the scroll wheel metal gear but not come in contact with the individual teeth formed on the scroll wheel metal gear. However, because the scroll wheel metal gear is made of a ferromagnetic material (e.g., steel, silicone steel, etc.), the teeth-like extensions of the permanent magnet interact magnetically with the individual teeth of the scroll wheel metal gear as the scroll wheel metal gear and scroll wheel 372 are rotated by a user. In such an orientation of the permanent magnet, the mouse magnetic scroll wheel device may operate in haptic feedback scroll mode with the user feeling, at the scroll wheel 372, the alternating strong interactions between the teeth-like extensions of the permanent magnet and the teeth of the scroll wheel metal gear and the weak interactions between the teeth-like extensions of the permanent magnet and the valleys between the individual teeth formed on the scroll wheel metal gear.

As described herein, the mouse includes a mouse microcontroller operatively coupled to an encoder 382. In an embodiment, the encoder 382 is in the form of a rotary encoder that detects the angular position and movement of the scroll wheel 372 and provides output to the mouse microcontroller indicating this angular position and movement of the scroll wheel 372. The mouse microcontroller may interpret this output from the encoder 382 and transmit scrolling input to a hardware processing device (e.g., hardware processor 102, FIG. 1) of the information handling system. In an embodiment, the encoder 382 includes a Hall effect sensor that is used to detect this angular position and rotation movement of the scroll wheel 372. The Hall effect sensor may do this by detecting the magnitude of the magnetic field of a circular Hall effect magnet 383 operatively coupled to the axle of the scroll wheel 372. As the circular Hall effect magnet 383 passes the Hall effect sensor of the encoder 382, the magnitude of the magnetic field created by the circular Hall effect magnet 383 is detected. The angular rotation of the scroll wheel 372 is thereby detected and provided to the mouse microcontroller.

In an embodiment, the encoder 382 may be used to detect when a threshold rounds-per-minute (RPM) of the scroll wheel 372 has been reached. In an embodiment, these RPMs or speed of rotation of the scroll wheel 372 may determine when to engage the scroll wheel 372 in the freespin scroll mode or maintain or re-engage the scroll wheel 372 into the haptic feedback scroll mode with mouse microcontroller executing code instructions of the scroll wheel haptic and freespin control system. For example, where the encoder 382 detects a quick acceleration or increased speed of rotations (e.g., increased RPMs) above a slow scrolling speed, the output from the encoder 382 may be interpreted by the mouse microcontroller, via execution of the scroll wheel haptic and freespin control system, that indicates that a freespin scroll mode is to be engaged. As such, the mouse microcontroller may send the signal to the EPM switch 386 to switch the polarity of the EPM of the EPM switch 386 in order to attract the permanent magnet towards the EPM thereby mechanically allowing the scroll wheel 372 to be freely rotated without haptic feedback being felt by the user. When the RPM or rotational speed of the scroll wheel 372 is detected by the encoder 382 to have slowed down below the threshold RPM of the scroll wheel 372, the mouse microcontroller interprets this output from the encoder 382, again via execution of the scroll wheel haptic and freespin control system, as indicating that a haptic feedback scroll mode is to be engaged or re-engaged. Accordingly, the mouse microcontroller sends a signal in the form of the electrical pulse of current or voltage to the EPM switch 386 to switch the polarity of the EPM in order to cause the permanent magnet to magnetically engage or re-engage with the scroll wheel metal gear as described herein.

Figure 4A:
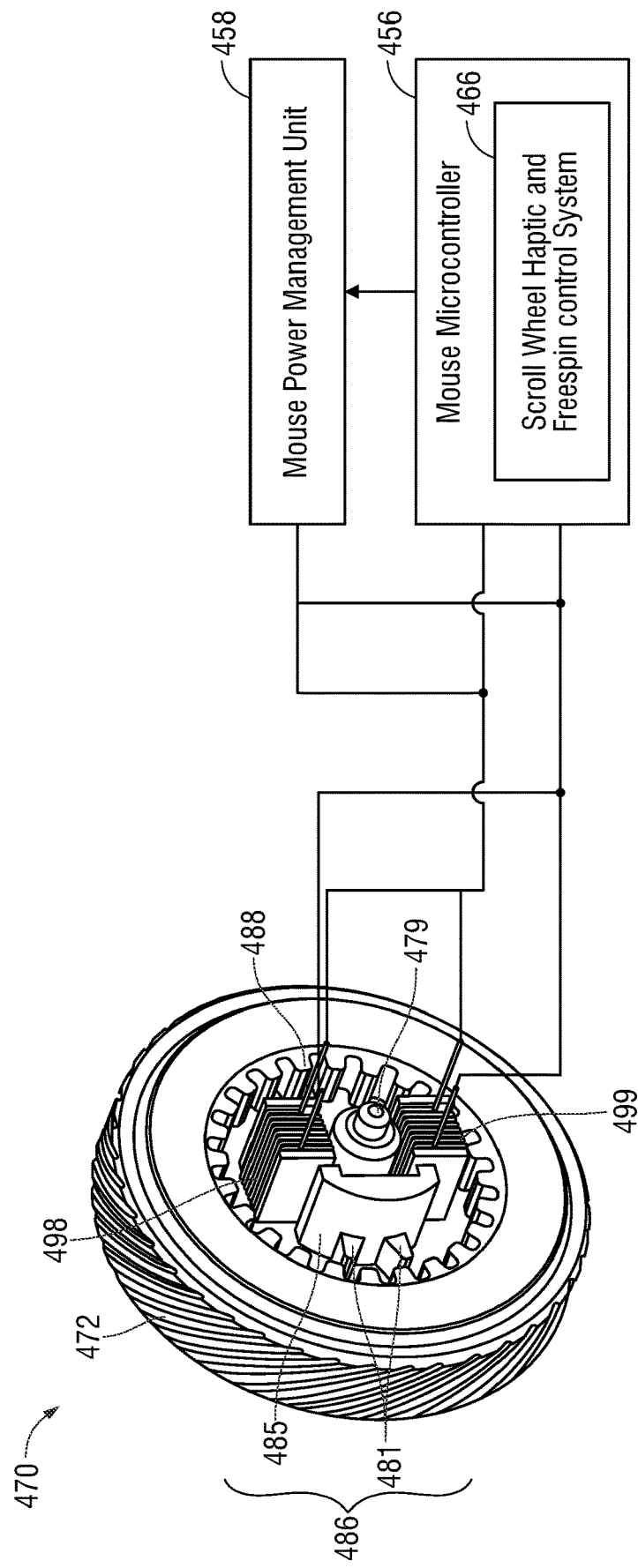
FIG. 4A is a perspective view and block diagram of a mouse magnetic scroll wheel device with an embedded magnetic haptic device and an EPM switch for a scroll wheel haptic and freespin control system for a wired or wireless mouse according to an embodiment of the present disclosure.

FIG. 4A is a perspective view and block diagram of a mouse magnetic scroll wheel device with an embedded magnetic haptic device in a scroll wheel with an EPM switch as controlled with a scroll wheel haptic and freespin control system for a wired or wireless mouse according to an embodiment of the present disclosure. FIG. 4A shows an enlarged view of the scroll wheel 472 and EPM switch 486 of a portion of the mouse magnetic scroll wheel device 470 as described herein. Additionally, the scroll wheel 472 is shown without the cradle of the mouse magnetic scroll wheel device 470 into which the scroll wheel 472 is placed as shown in the embodiments of FIGS. 3A and 3B.

As described herein, the mouse magnetic scroll wheel device 470 described in connection with FIG. 4A includes embodiments where a mouse magnetic scroll wheel device has a capability to switch between a haptic feedback scroll mode or a freespin scroll mode. The capability to switch between a haptic feedback scroll mode and a freespin scroll mode is accomplished, in part, through the use of a EPM switch 486 selectively magnetically engaging with a permanent magnet 485 formed within the hollowed-out portion of the scroll wheel 472. In an embodiment, the EPM switch 486 includes a first EPM 498 and a second EPM 499 arranged around the scroll wheel axle 479. It is contemplated that more or fewer EPMs may be used in the present embodiments and the use of a first EPM 498 and second EPM 499 is merely an example orientation and placement of these EPMs in the EPM switch 486.

The first EPM 498 and second EPM 499 may be arranged to magnetically engage with the permanent magnet 485. As described herein, each of the first EPM 498 and second EPM 499 may operate to each repel or attract the permanent magnet 485 during a haptic feedback scroll mode or a freespin scroll mode, respectively. Each of the first EPM 498 and second EPM 499 include electrical leads the operatively couple the first EPM 498 and second EPM 499 to the mouse microcontroller 456 executing the scroll wheel haptic and freespin control system 466 and provide for a current or voltage pulse as necessary to change modes as described herein.

During operation, the each of the first EPM 498 and second EPM 499 of the EPM switch 486 receives an electrical pulse of current or voltage from a mouse PMU 458 under the direction of the mouse microcontroller 456 executing the scroll wheel haptic and freespin control system 466. This electrical pulse of current or voltage may be transmitted to the EPM switch 386 via execution of the scroll wheel haptic and freespin control system by the mouse microcontroller and based on input from an encoder formed, in an embodiment, on an opposite side of the scroll wheel 472 (e.g., as shown in FIG. 3B) and operatively coupled to the scroll wheel axle 479. When the electrical pulse of current or voltage is received at the first EPM 498 and second EPM 499 of the EPM switch 486, the polarity of each of the first EPM 498 and second EPM 499 is switched such that the scroll wheel permanent magnet 485 disposed therein is attracted to the first EPM 498 and second EPM 499. In an embodiment, the scroll wheel permanent magnet 485 may be operatively coupled to a limited sliding track formed in the EPM switch housing (not shown) that allows the scroll wheel permanent magnet 485 to slide laterally outward or inward in the hollowed-out core portion of the scroll wheel 472 relative to the scroll wheel axle 479 and depending on the polarity of the first EPM 498 and second EPM 499.

When the polarity of the first EPM 498 and second EPM 499 are switched to attract the scroll wheel permanent magnet 485 (i.e., opposite polarity), this causes the magnetic interaction between the scroll wheel permanent magnet 485 and the scroll wheel metal gear 476 formed on an interior surface of the hollowed-out portion of the scroll wheel 472.

This disengagement of the magnetic interaction between the scroll wheel metal gear 488 and the permanent magnet 485 allows the scroll wheel 472 to transition from being operated under a haptic feedback scroll mode to a freespin scroll mode. Indeed, because there is no magnetic interaction between the scroll wheel permanent magnet 485 and the scroll wheel metal gear 476, the scroll wheel 472 may be rotated freely without haptic feedback being felt by the user. This may be beneficial when the user is attempting to scroll across a large document or website, for example, being presented to the user on a graphical user interface (GUI) at a video display device (e.g., video display device 144, FIG. 1). It is appreciated that the electrical pulse of current or voltage sent to the first EPM 498 and second EPM 499 causes the polarity of the EPMs 498, 499 to switch into a semi-permanent state such that consistent current or voltage is not necessary to maintain this polarity used to attract the permanent magnet. This reduces the amount of power necessary to maintain the scroll wheel 472 in the freespin scroll mode thereby reducing the carbon footprint associated with replacing batteries (e.g., dry cell or rechargeable batteries) in a wireless version of the mouse or constantly powering mouse via a wired connection in order to maintain this freespin scroll mode.

In an embodiment, a subsequent electrical pulse of current or voltage provided to the EPMs 498, 499 may switch the polarity of the EPMs 498, 499 such that the permanent magnet 485 is repelled away from the EPMs 498, 499. This causes the permanent magnet 485 to slide laterally away from the scroll wheel axle 479 of the scroll wheel 472 such that the permanent magnet 485 engages or re-engages with the ferromagnetic material of the scroll wheel metal gear 476. In an embodiment, the permanent magnet 485 includes one or more teeth-like extensions 481 that are configured to extend toward a tip diameter or addendum circle of the scroll wheel metal gear 476 but not come in contact with the individual teeth formed on the scroll wheel metal gear 476. However, because the scroll wheel metal gear 476 is made of a ferromagnetic material (e.g., steel, silicone steel, etc.), the teeth-like extensions 481 of the permanent magnet 485 interact magnetically with the individual teeth of the scroll wheel metal gear 476 as the s scroll wheel metal gear 476 and scroll wheel 472 are rotated by a user. In such an orientation of the permanent magnet 485, the mouse magnetic scroll wheel device may operate in haptic feedback scroll mode with the user feeling, at the scroll wheel 472, the alternating strong interactions between the teeth-like extensions 481 of the permanent magnet 485 and the teeth of the scroll wheel metal gear 476 and the weak interactions between the teeth-like extensions 481 of the permanent magnet 485 and the valleys between the individual teeth formed on the scroll wheel metal gear 476.

As described herein, the mouse includes a mouse microcontroller 456 operatively coupled to an encoder (not shown). In an embodiment, the encoder is in the form of a rotary encoder that detects the angular position and movement of the scroll wheel 472 and provides output to the mouse microcontroller 456 indicating this angular position and movement of the scroll wheel 472. The mouse microcontroller 456 may interpret this output from the encoder and transmit scrolling input to a hardware processing device (e.g., hardware processor 102, FIG. 1) of the information handling system. In an embodiment, the encoder includes a Hall effect sensor that is used to detect this angular position and rotation movement of the scroll wheel 472. The Hall effect sensor may do this by detecting the magnitude of the magnetic field of a circular Hall effect magnet (not shown) operatively coupled to the scroll wheel axle 479 of the scroll wheel 472. As the circular Hall effect magnet passes the Hall effect sensor of the encoder, the magnitude of the magnetic field created by the circular Hall effect magnet is detected. The angular rotation of the scroll wheel 472 is thereby detected and provided to the mouse microcontroller.

In an embodiment, the encoder may be used to detect when a threshold RPM of the scroll wheel 472 has been reached. In an embodiment, these RPMs or speed of rotation of the scroll wheel 472 may determine when to engage the scroll wheel 472 in the freespin scroll mode or maintain or re-engage the scroll wheel 472 into the haptic feedback scroll mode. For example, where the encoder detects a quick acceleration or increased speed of rotations (e.g., increased RPMs) above a slow scrolling speed, the output from the encoder may be interpreted by the mouse microcontroller 456, via execution of the scroll wheel haptic and freespin control system 466, that indicates that a freespin scroll mode is to be engaged. As such, the mouse microcontroller 456 may send the signal to the EPMs 498, 499 of the EPM switch 486 to switch the polarity of the EPMs 498, 499 in order to attract the permanent magnet 485 towards the EPMs 498, 499 thereby mechanically allowing the scroll wheel 472 to be freely rotated without haptic feedback being felt by the user. When the RPM or rotational speed of the scroll wheel 472 is detected by the encoder to have slowed down below the threshold RPM of the scroll wheel 472, the mouse microcontroller 456 interprets this output from the encoder, again via execution of the scroll wheel haptic and freespin control system 466, as indicating that a haptic feedback scroll mode is to be engaged or re-engaged. Accordingly, the mouse microcontroller 456 send a signal to the mouse PMU 458 to transmit an electrical pulse of current or voltage to the EPMs 498, 499 to switch the polarity of the EPMs 498, 499 in order to cause the permanent magnet 485 to magnetically engage or re-engage with the scroll wheel metal gear 476 as described herein.

Figure 4B:
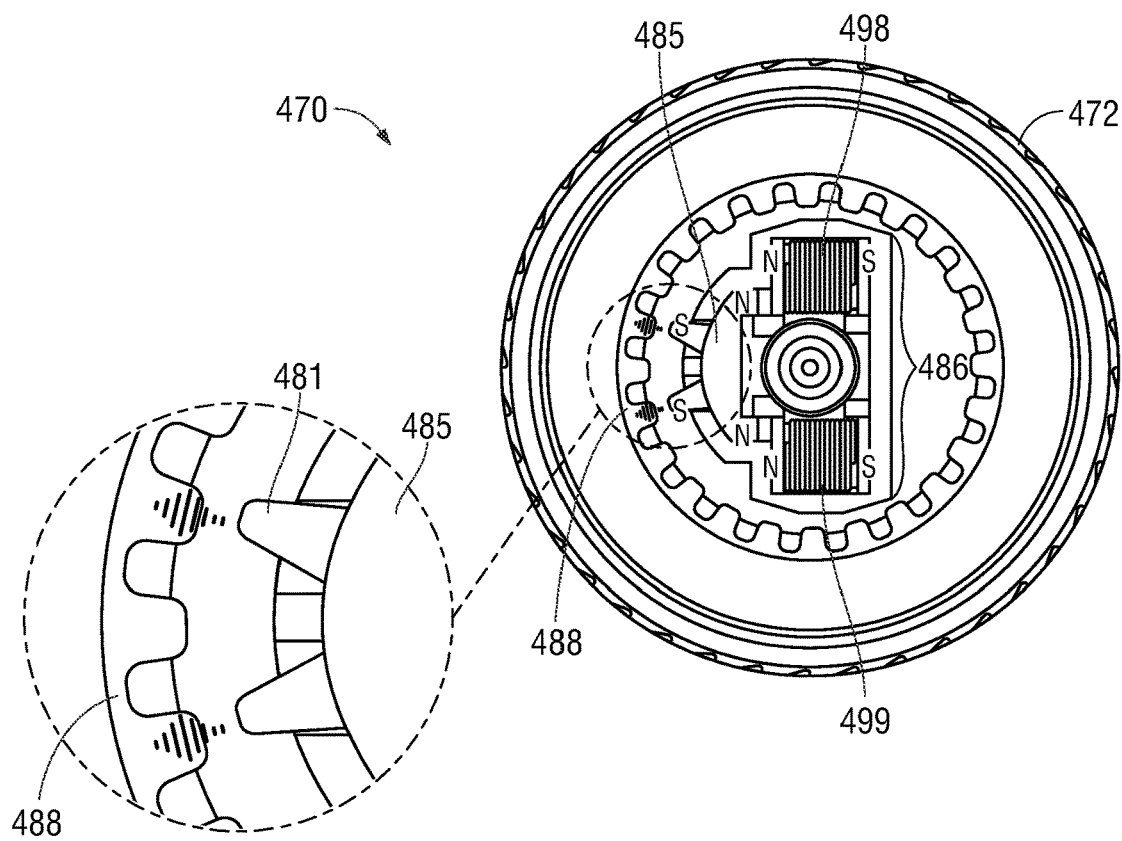
FIG. 4B is a perspective side view and close up view of a mouse magnetic scroll wheel device with an embedded magnetic haptic device and an EPM switch with a permanent magnet in an extended position for a wired or wireless mouse according to an embodiment of the present disclosure.

FIG. 4B is a perspective view and close up view of a mouse magnetic scroll wheel device 470 with an embedded magnetic haptic device in the scroll wheel and an EPM switch 486 with a permanent magnet 485 in an extended position providing for haptic response for a wired or wireless mouse according to an embodiment of the present disclosure. FIG. 4B also includes an enlarged window showing the arrangement of the teeth-like extensions 481 relative to the teeth of the scroll wheel metal gear 476. As described herein, the location of the teeth-like extensions 481 of the permanent magnet 485 relative to the teeth of the scroll wheel metal gear 476 is adjusted by an EPM switch 486 when an encoder detects that the RPMs or speed of rotation of the scroll wheel 472 is above or below a threshold RPM. This detection by the encoder signals the mouse microcontroller (not shown) to direct the mouse PMU (not shown) to provide an electrical pulse of current or voltage to the EPMs 498, 499 to switch the polarity of the EPMs 498, 499. When the speed of rotation of the scroll wheel 472 falls below a threshold RPM for example, the electrical pulse switches polarity of EPMs 498 and 499 to cause the permanent magnet 485 to slide laterally away from the scroll wheel axle 479 of the scroll wheel 472 such that the permanent magnet 485 magnetically engages or re-engages with the ferromagnetic material of the scroll wheel metal gear 476. In an embodiment, the permanent magnet 485 includes one or more teeth-like extensions 481 that are configured to extend toward a tip diameter or addendum circle of the scroll wheel metal gear 476 but not come in contact with the individual teeth formed on the scroll wheel metal gear 476. However, because the scroll wheel metal gear 476 is made of a ferromagnetic material (e.g., steel, silicone steel, etc.), the teeth-like extensions 481 of the permanent magnet 485 interact magnetically with the individual teeth of the scroll wheel metal gear 476 to create haptic feedback as the scroll wheel metal gear 476 and scroll wheel 472 are rotated by a user. In such an orientation of the permanent magnet 485, the mouse magnetic scroll wheel device may operate in haptic feedback scroll mode with the user feeling as haptic feedback, at the scroll wheel 472, the alternating strong interactions between the teeth-like extensions 481 of the permanent magnet 485 and the teeth of the scroll wheel metal gear 476 and the weak interactions between the teeth-like extensions 481 of the permanent magnet 485 and the valleys between the individual teeth formed on the scroll wheel metal gear 476.

Figure 4C:
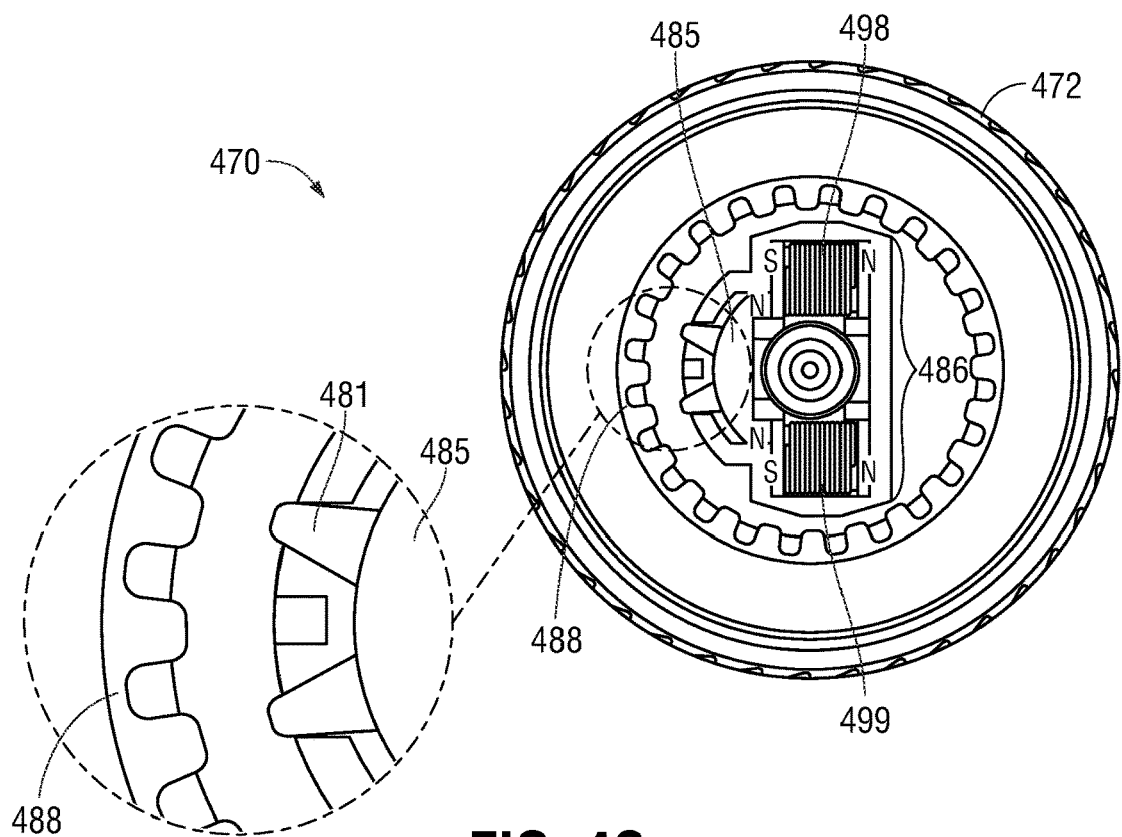
FIG. 4C is a perspective side view and close up view of a mouse magnetic scroll wheel device with an embedded magnetic haptic device and an EPM switch with a permanent magnet in a retracted position for a wired or wireless mouse according to an embodiment of the present disclosure.

FIG. 4C is a perspective view and close up view of a mouse magnetic scroll wheel device 470 with an embedded magnetic haptic device and an EPM switch (not shown) with a permanent magnet 485 in a retracted position for freespin operation for a wired or wireless mouse according to an embodiment of the present disclosure. FIG. 4C also includes an enlarged window showing the arrangement of the teeth-like extensions 481 relative to the teeth of the scroll wheel metal gear 476. As shown, the teeth-like extension 481 of the permanent magnet 485 are further away from the teeth of the scroll wheel metal gear 476 than that depicted in FIG. 4B and the magnetic interaction has dissipated.

As described herein, the retraction of the teeth-like extensions 481 of the permanent magnet 485 relative to the teeth of the scroll wheel metal gear 476 is accomplished when an encoder detects that the RPMs or speed of rotation of the scroll wheel 472 meets or exceeds the threshold RPM. When the electrical pulse of current or voltage is received at the first EPM 498 and second EPM 499 of the EPM switch 486, the polarity of each of the first EPM 498 and second EPM 499 is switched such that the scroll wheel permanent magnet 485 disposed therein is attracted to the first EPM 498 and second EPM 499. In an embodiment, the scroll wheel permanent magnet 485 may be operatively coupled to a limited sliding track (not shown) that allows the scroll wheel permanent magnet 485 to slide laterally outward or inward in the hollowed-out core portion of the scroll wheel 472 relative to the scroll wheel axle 479 depending on the polarity of the first EPM 498 and second EPM 499. When the polarity of the first EPM 498 and second EPM 499 are switched to attract the scroll wheel permanent magnet 485, this pulls the scroll wheel permanent magnet 485 away from the scroll wheel metal gear 476 (e.g., also called, in this embodiment, the scroll wheel metal gear) formed on an interior surface of the hollowed-out portion of the scroll wheel 472 causing the magnetic interaction to dissipate.

This disengagement of the magnetic interaction between the scroll wheel metal gear 476 and the permanent magnet 485 allows the scroll wheel 472 to transition from being operated under a haptic feedback scroll mode to a freespin scroll mode. Indeed, because there is no magnetic interaction between the scroll wheel permanent magnet 485 and the scroll wheel metal gear 476, the scroll wheel 472 may be rotated freely without haptic feedback being felt by the user. This may be beneficial when the user is attempting to scroll across a large document or website, for example, being presented to the user on a graphical user interface (GUI) at a video display device (e.g., video display device 144, FIG. 1). It is appreciated that the electrical pulse of current or voltage sent to the first EPM 498 and second EPM 499 causes the polarity of the EPMs 498, 499 to switch into a semi-permanent state such that consistent current or voltage is not necessary to maintain this polarity used to attract the permanent magnet. This reduces the amount of power necessary to maintain the scroll wheel 472 in the freespin scroll mode thereby reducing the carbon footprint associated with replacing batteries (e.g., dry cell or rechargeable batteries) in a wireless version of the mouse or constantly powering mouse via a wired connection in order to maintain this freespin scroll mode.

Figure 5A:
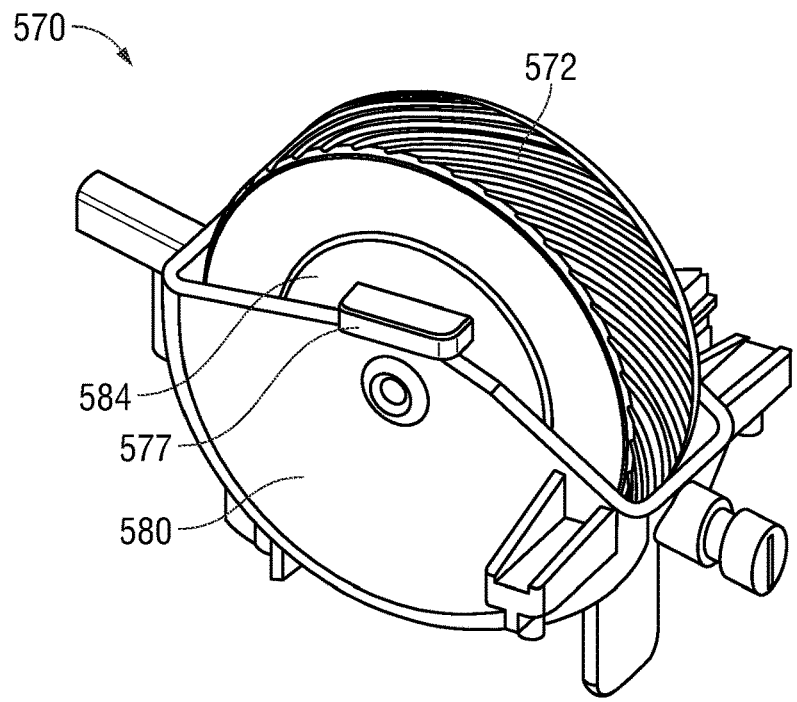
FIG. 5A is a perspective view of a mouse magnetic scroll wheel device with an embedded magnetic haptic device for a wired or wireless mouse according to an embodiment of the present disclosure.
Figure 5B:
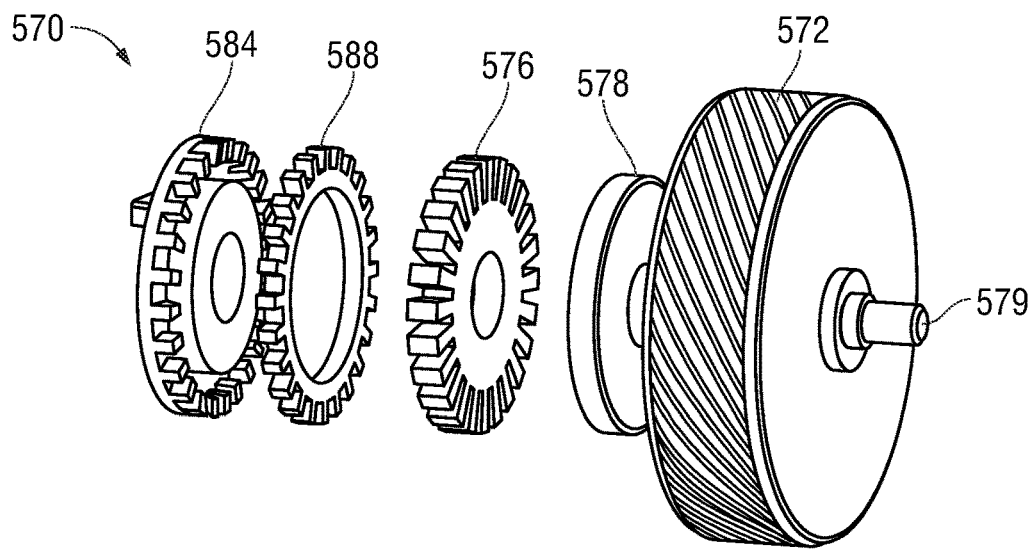
FIG. 5B is a perspective, exploded view of a mouse magnetic scroll wheel device with an embedded magnetic haptic device for a wired or wireless mouse according to an embodiment of the present disclosure.
Figure 5C:
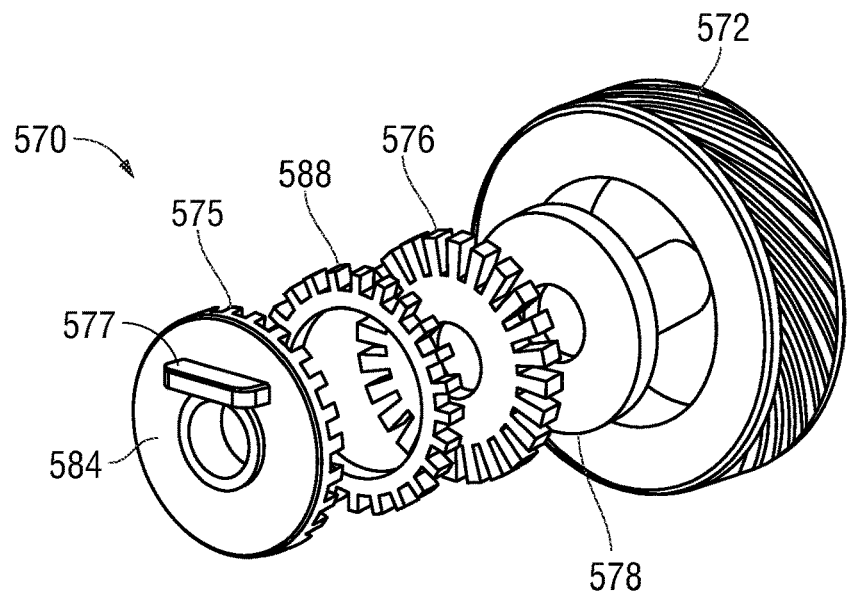
FIG. 5C is another perspective, exploded view of a mouse magnetic scroll wheel device with an embedded magnetic haptic device for a wired or wireless mouse according to an embodiment of the present disclosure.
Figure 5D:
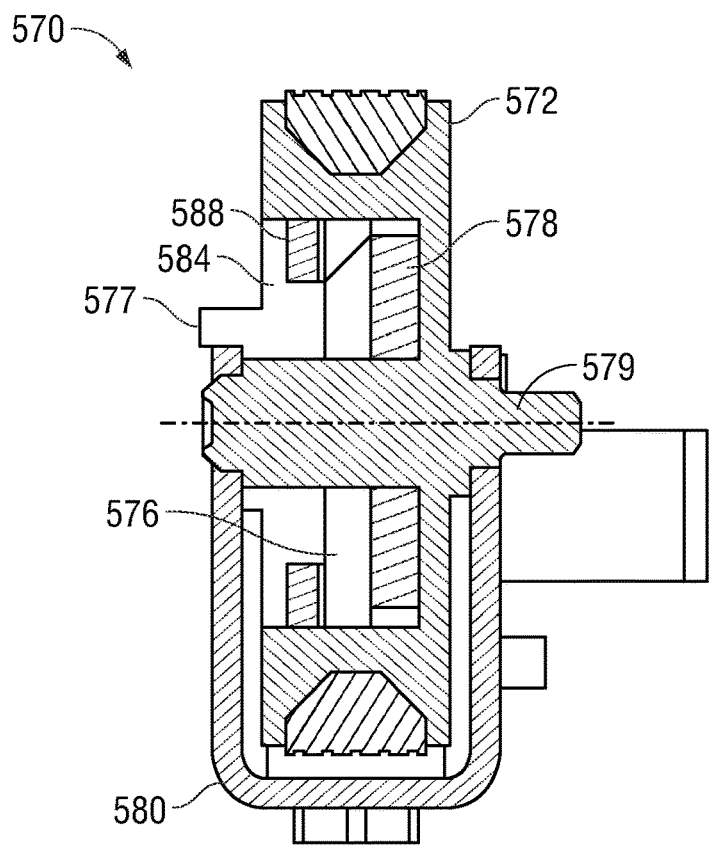
FIG. 5D is a cross-section view of a mouse magnetic scroll wheel device with an embedded magnetic haptic device for a wired or wireless mouse according to an embodiment of the present disclosure.

FIG. 5A is a perspective view of a mouse magnetic scroll wheel device 570 with an embedded magnetic haptic device in a scroll wheel for providing a haptic response for a wired or wireless mouse according to an embodiment of the present disclosure. FIG. 5A shows the mouse magnetic scroll wheel device 570 in an assembled state. Additionally, FIG. 5B is a perspective, exploded view of a mouse magnetic scroll wheel device 570 with an embedded magnetic haptic device in the scroll wheel 572 for a haptic response for a wired or wireless mouse according to an embodiment of the present disclosure. Further, FIG. 5C is another perspective, exploded view of a mouse magnetic scroll wheel device 570 in the scroll wheel 572 with an embedded magnetic haptic device for haptic response for a wired or wireless mouse according to an embodiment of the present disclosure. Still further, FIG. 5D is a cross-section view of a mouse magnetic scroll wheel device 570 with an embedded magnetic haptic device in the scroll wheel 572 for haptic response for a wired or wireless mouse according to an embodiment of the present disclosure. It is appreciated that the mouse magnetic scroll wheel device 570 with the cradle 580 may be installed into a housing of a wired or wireless mouse as shown in FIG. 2C herein.

In the embodiments shown in FIGS. 5A through 5D, the mouse magnetic scroll wheel device 570 may utilize a different magnetic haptic device structure than those shown in, for example, FIGS. 3A through 4C. The mouse magnetic scroll wheel device 570 shown in FIGS. 5A through 5D may include a scroll wheel magnet 578 and a scroll wheel metal gear 576 installed around an axle 579 and nested in core of a hollowed-out portion of the scroll wheel 572 to form a built-in magnetic haptic feedback system. The scroll wheel magnet 578 may be a permanent magnet in an embodiment. The scroll wheel magnet 578 and the scroll wheel metal gear 576 are affixed to the spinning structure of the scroll wheel 572 in its core and spin in the cradle 580 with the scroll wheel 572 when rotated by the user. The scroll wheel magnet 578 magnetizes the scroll wheel metal gear 576 for magnetic interaction as it rotates adjacent to the cradle metal gear 588 as described further in the embodiments herein.

In an embodiment, a second portion of the built-in magnetic haptic feedback system is also operatively coupled to the axle 579 of the scroll wheel 572 but does not spin with the axle 579 or the scroll wheel 572. A cradle gear holder 584 is formed to hold the teeth of a cradle metal gear 588 in an embodiment. The cradle gear holder 584 may hold the teeth of the cradle metal gear 588 via use of cradle gear holder fingers 575 that extend away from a side surface of the cradle gear holder 584 towards the cradle metal gear 588. The cradle gear holder fingers 575 may be spaced along an outer circumference of the cradle gear holder 584 such that they intermesh with the individual gears of the cradle metal gear 588. In an embodiment, the cradle gear holder 584 further includes a cradle gear holder shelf or ridge 577 formed on a side surface of the cradle gear holder 584 opposite the side where the cradle gear holder fingers 575 are formed. The cradle gear holder shelf or ridge 577 may interface with a surface of the cradle 580 such that the cradle gear holder 584 is prevented from rotating with the scroll wheel 572, scroll wheel magnet 578, and scroll wheel metal gear 576. It is appreciated that other mechanical devices (e.g., an outer notch or other ridge) may be used to prevent the cradle gear holder 584 from rotating and, thereby, also preventing the cradle metal gear 588 from rotating relative to the scroll wheel 572. In an embodiment, the cradle gear holder 584 may form a monolithic piece with the cradle 580 such that the cradle metal gear 588 is held in place during scrolling of the scroll wheel 572. In an embodiment, the cradle gear holder 584 and cradle metal gear 588 are formed or installed on the axle 579 and inserted into the core of the hollowed-out portion of the scroll wheel 572.

During operation, the scroll wheel permanent magnet 578 magnetizes the scroll wheel metal gear 576 and its teeth. Because the scroll wheel metal gear 576 is made of a ferromagnetic material, the scroll wheel magnet 578 magnetically engages with the scroll wheel metal gear 576 thereby causing the scroll wheel metal gear 576 to rotate with the scroll wheel magnet 578 and scroll wheel 572 when rotated by the user.

In an embodiment, the fixed cradle metal gear cradle metal gear 588 is also made of a ferromagnetic material. During operation, some magnetic attraction occurs between the cradle metal gear 588 and scroll wheel metal gear 576 when the cradle metal gear 588 is adjacent to the scroll wheel metal gear 576, although there is a gap between them as shown in FIG. 5D. As the scroll wheel 572 is rotated by a user in order to provide scrolling input, the scroll wheel permanent magnet 578 and the scroll wheel metal gear 576 also rotate. The magnetized scroll wheel metal gear 576 next to the scroll wheel permanent magnet 578 rotates on the axle 579 adjacent to the cradle metal gear 588 and is fixed from rotating by the cradle gear holder 584. As teeth of the magnetized scroll wheel metal gear 576 align with the teeth of cradle metal gear 588 during rotation, a greater amount of the ferromagnetic material for the cradle metal gear 588 aligns with the magnetized scroll wheel metal gear 576. When this alignment of teeth happens, the magnetic attraction between the cradle metal gear 588 and the magnetized scroll wheel metal gear 576 increases. When the teeth of the scroll wheel metal gear 576 and scroll wheel magnet 578 are not aligned, such as when the teeth of the rotating magnetized scroll wheel metal gear 576 aligns with the plastic holders that are the cradle gear holder fingers 575 of the cradle metal gear holder 584, the magnetic attraction is lessened. These alternating levels of magnetic attraction between the rotating scroll wheel metal gear 576 and the fixed cradle metal gear 588 creates a magnetized haptic feedback in rotation of the scroll wheel 572 in the cradle 580 that is transmitted through the scroll wheel 572 and felt by a user. Further, the axle 579 of the scroll wheel 572 may also have an encoder (not shown) operatively coupled thereto as described herein. In an embodiment, the encoder is a Hall sensor encoder detector that detects a Hall sensor magnet on the axle 579 of the scroll wheel as with embodiments herein. Again, the encoder is used to determine the angular rotation and rotational speed of the scroll wheel 572. This angular rotation and rotational speed data is sent to the mouse microcontroller (not shown) and transmitted to the information handling system as scrolling input as described herein.

Figure 6:
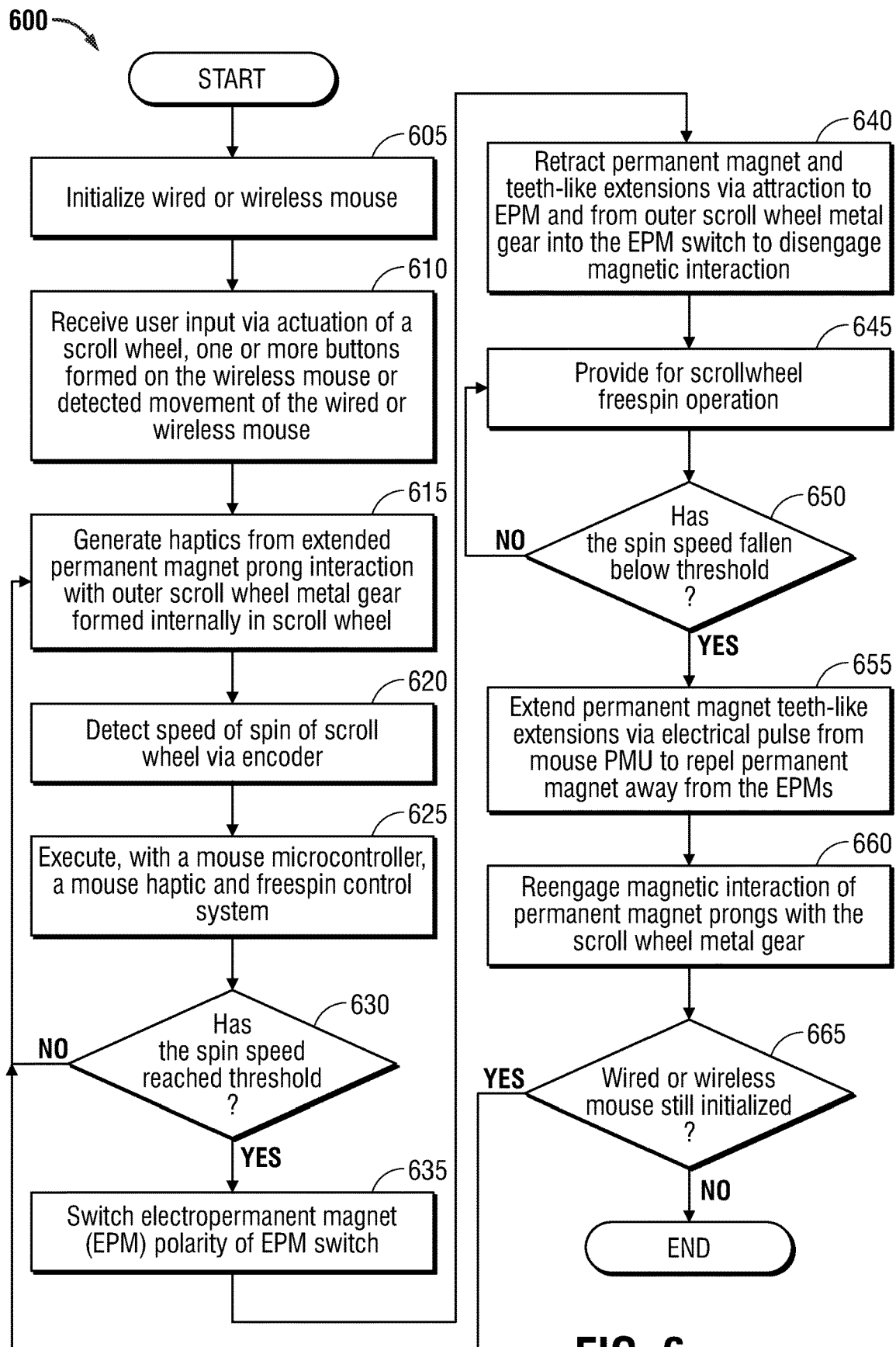
FIG. 6 is a flow diagram illustrating a method of operating a wired or wireless mouse with a mouse magnetic scroll wheel device and an EPM switch to switch between a haptic response or freespin operation of the magnetic scroll wheel according to an embodiment of the present disclosure.

FIG. 6 is a flow diagram illustrating a method 600 of operating a wired or wireless mouse with a mouse magnetic scroll wheel device and an EPM switch to switch between a haptic response or freespin operation of the magnetic scroll wheel according to an embodiment of the present disclosure. As described herein, this method is directed to the operation of the embedded magnetic haptic device described herein in connection with, for example, FIGS. 3A through 4C.

The method 600 may include initializing the wired or wireless mouse at block 605. In an embodiment, the initialization of the wired or wireless mouse may include a user actuating a power button or switch to cause power to be provided to, at least, the wireless mouse microcontroller.

At block 610, the method 600 includes receiving user input via actuation of a scroll wheel, one or more buttons formed on the wireless mouse, or detected movement of the wired or wireless mouse. As described herein, the scroll wheel may include an encoder that detects the rotation or scrolling of the scroll wheel. Additionally, the one or more buttons may include button actuators that, when pressed, detect input indicating, for example, selection input from the wired or wireless mouse. Further, a roller ball with associated roller grips or an optical tracking device (e.g., light-emitting diode and photodiodes) may be used to detect the movement of the wired or wireless mouse.

The method 600 further includes generating haptics from extended permanent magnet prong interaction with outer metal gear formed internally in a scroll wheel. As described herein, the mouse magnetic scroll wheel device 170 may include an EPM switch disposed within a cradle and partially disposed within a hollowed-out core portion of the scroll wheel. The haptics, in an embodiment, are created via interaction of a permanent magnet formed within the hollowed-out portion of the scroll wheel and a scroll wheel metal gear formed on an interior surface of the hollowed-out portion of the scroll wheel. The permanent magnet includes teeth-like extensions that are configured to extend toward a tip diameter or addendum circle and the teeth of the scroll wheel metal gear but not come in contact with the individual teeth formed on the scroll wheel metal gear. In an embodiment, the EPM switch includes one or more EPMs that may be selectively configured to attract or repel the permanent magnet when an electrical pulse of current or voltage is received at the EPMs. The electrical pulse of current or voltage is sent from a mouse PMU under the direction of a mouse microcontroller executing a scroll wheel haptic and freespin control system. By causing the EPMs to change or arrange their polarity to repel the permanent magnet, the teeth-like extensions of the permanent magnet magnetically engage with the teeth of the scroll wheel metal gear. In an embodiment, the scroll wheel metal gear is made of a ferromagnetic material. With the metal teeth of the internal scroll wheel metal gear pointing inward, when the scroll wheel permanent magnet is urged outward, the scroll wheel permanent magnet will be moved close enough to magnetically interact with the internal scroll wheel metal gear. The scroll wheel permanent magnet may include one or more teeth-like extensions so that a pointed magnetic interaction may occur between the scroll wheel permanent magnet in an outward position and alternate levels of magnetic interaction with rotation of the teeth of the internal scroll wheel metal gear in the outside of the core of the hollowed-out portion of the scroll wheel. In such an embodiment, the mouse magnetic scroll wheel device may operate in haptic feedback scroll mode.

At block 620, the method 600 includes detecting the speed of rotation or spin of the scroll wheel using an encoder. As described herein, the mouse includes a mouse microcontroller operatively coupled to an encoder. In an embodiment, the encoder is in the form of a rotary encoder that detects the angular position and movement of the scroll wheel and provides output to the mouse microcontroller indicating this angular position and movement of the scroll wheel. The mouse microcontroller may interpret this output from the encoder and transmit scrolling input to a hardware processing device (e.g., hardware processor 102, FIG. 1) of the information handling system. In an embodiment, the encoder includes a Hall effect sensor that is used to detect this angular position and rotation movement of the scroll wheel. The Hall effect sensor may do this by detecting the magnitude or flux of the magnetic field of a circular Hall effect magnet operatively coupled to the axle of the scroll wheel. As the circular Hall effect magnet passes the Hall effect sensor of the encoder, the magnitude or flux of the magnetic field created by the circular Hall effect magnet is detected. The angular rotation and speed of rotation of the scroll wheel is thereby detected and provided to the mouse microcontroller.

The method further includes executing a scroll wheel haptic and freespin control system at the mouse microcontroller at block 625. In an embodiment, the scroll wheel haptic and freespin control system may, when executed by the wireless mouse microcontroller, determine when scroll wheel input rotation has reached or exceeded a threshold speed level of revolutions per minute (RPM). The scroll wheel haptic and freespin control system may also determine, based on scroll speed level such as determined from the encoder of the scroll wheel, when to switch the EPM switch system to automatically switch between haptic feedback and freespin scrolling in some embodiments. In an embodiment, the scroll wheel haptic and freespin control system, when executed by the wireless mouse microcontroller, determines when a threshold speed of scrolling has reduced again below a threshold speed level of rotation to automatically switch the EPM switch device and reengage the magnetic haptic feedback in other embodiments. This allows the wired or wireless mouse to automatically and dynamically switch from operating with a scrolling haptic feedback mode to a freespin scrolling mode or high-speed scrolling mode and back again providing an additional feature for the user.

At block 630, the mouse microcontroller may determine if this spin speed (e.g., an RPM or rotational speed of the scroll wheel) has reached the threshold. In an embodiment, the rotation threshold may be set at more than one RPM. In an embodiment, the rotation threshold may be set at a certain rotation speed that indicates, based on user preferences, that the speed of scrolling exceeds a normal scroll speed used to scroll through a GUI presented to the user via a video display device of the information handling system or that scrolling continues for an extended period of time at a threshold speed level or average threshold speed level of rotation over that time period. In other embodiments, the switching between a scrolling haptic feedback mode and a freespin scrolling mode or high-speed scrolling mode may be triggered by manual input selected by a user via a button actuation or mouse driver software interface. Actuation of the same EPM switch may be triggered by the mouse microcontroller receiving this manual user selection in embodiments herein. The manual user selection between a scrolling haptic feedback mode or a freespin scrolling mode or high-speed scrolling mode may be received at the mouse microcontroller executing code instructions of the mouse haptic and freespin control system according to embodiments herein.

Where the spin speed does not exceed the threshold, the method 600 returns to block 615 as described herein. Where the spin speed does exceed the threshold, the method 600 includes, at block 635, switching the polarity of the EPMs of the EPM switch. As described herein, an electrical pulse of current or voltage is received at the EPM switch causing the polarity of the EPMs of the EPM switch to change. As this occurs, the scroll wheel permanent magnet disposed within the hollowed-out portion of the scroll wheel is attracted to the EPMs of the EPM switch. In an embodiment, the scroll wheel permanent magnet may be operatively coupled to a limited sliding track that allows the scroll wheel permanent magnet to slide laterally outward or inward in the hollowed-out core portion of the scroll wheel relative to the scroll wheel axle depending on the polarity of the EPM switch. When the polarity of the EPMs of the EPM switch are switched to attract the permanent magnet, this retracts the scroll wheel permanent magnet and causes the magnetic interaction between the permanent magnet and the scroll wheel metal gear formed on an interior surface of the hollowed-out portion of the scroll wheel to be reduced or eliminated. This disengagement of the magnetic interaction between the scroll wheel metal gear and the permanent magnet allows the scroll wheel to transition from being operated under a haptic feedback scroll mode to a freespin scroll mode. Indeed, because there is little or no magnetic interaction between the permanent magnet and the scroll wheel metal gear, the scroll wheel may be rotated freely without haptic feedback being felt by the user. This may be beneficial when the user is attempting to scroll across a large document or website, for example, being presented to the user on a graphical user interface (GUI) at a video display device. It is appreciated that the electrical pulse of current or voltage sent to the EPM switch causes the polarity of the EPM to switch into a semi-permanent state such that consistent current or voltage is not necessary to maintain this polarity used to attract the permanent magnet. This reduces the amount of power necessary to maintain the scroll wheel in the freespin scroll mode thereby reducing the carbon footprint associated with replacing batteries (e.g., dry cell or rechargeable batteries) in a wireless version of the mouse or constantly powering mouse via a wired connection in order to maintain this freespin scroll mode.

At block 640, the operation of the EPMs of the EPM switch having an electrical pulse switch polarity to attract the scroll wheel magnet causes the retraction of the permanent magnet and its teeth-like extensions via the attraction to the EPMs. This causes the permanent magnet to retract from outer metal gear and towards the EPM switch so that the magnetic interaction between the scroll wheel metal gear and the permanent magnet is disengaged as described herein. At this point, at block 645, scroll wheel freespin operation is provided to the user so that a user may more easily scroll through a GUI presented on a video display device, for example.

At block 650, the mouse microcontroller may execute the scroll wheel haptic and freespin control system to continuously monitor whether the spin speed has fallen below the threshold from the encoder. Where the spin speed has not fallen below the threshold at block 650, the method 600 returns to block 645 for the mouse microcontroller to continue with scroll wheel freespin operation and to monitor for changes in scroll wheel rotation spin speed.

Where the spin speed has fallen below the threshold at block 650, the method 600 continues to block 655 by extending the teeth-like extensions of the permanent magnet towards the scroll wheel metal gear by again sending, via the mouse PMU, an electrical pulse of current or voltage to the EPMs of the EPM switch the polarity of the EPMs. By switching the polarity of the EPMs, the permanent magnet is repelled away from the EPMs causing the teeth-like extensions of the scroll wheel permanent magnet to move closer to, but not touch, the teeth formed on the scroll wheel metal gear. At block 660, this magnetically re-engages the interaction of the permanent magnet and its teeth-like extensions with the scroll wheel metal gear to again provide haptic feedback during scrolling as described in embodiments herein for a haptic scrolling mode of operation.

At block 665, the method 600 includes determining whether the wireless mouse is still initiated. Where the wireless mouse is still initiated, the method 600 proceeds to block 615 to perform the methods described herein. Where the wireless mouse is no longer initiated, the method 600 may end.

The blocks of the flow diagrams of FIG. 6 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A mouse having a mouse magnetic scroll wheel device operatively couplable to an information handling system comprising:
   a mouse microcontroller;
   a mouse power management unit (PMU) to provide power to the mouse microcontroller and an encoder for the mouse magnetic scroll wheel device;
   the mouse magnetic scroll wheel device having a scroll wheel with a scroll wheel outer surface, an axle, and a hollowed out core portion of a scroll wheel structure, where the axle is operatively coupled to the encoder to record scrolling input from a user;
   a cradle to receive the axle of the scroll wheel such that the scroll wheel is rotatable in the cradle;
   a scroll wheel metal internal gear formed into an outer rim of the hollowed out core portion of the scroll wheel structure with teeth disposed towards the axle; and
   a scroll wheel permanent magnet disposed in the hollowed out core portion of the scroll wheel structure and having a magnet structural extension disposed within a magnetic interaction distance of the teeth of the scroll wheel metal internal gear such that magnetic interaction of the magnet structural extension with the teeth as the scroll wheel metal internal gear rotates past the permanent magnet generates a magnetic haptic feedback for the scroll wheel, where the scroll wheel permanent magnet is slideable relative to an electropermanent magnet (EPM) switch within the hollowed out core portion of the scroll wheel structure.

2. The mouse of claim 1 further comprising:
   the scroll wheel permanent magnet operatively coupled to EPM switch disposed in the hollowed out core portion of the scroll wheel structure, where the scroll wheel permanent magnet is slideable relative to the EPM switch in the hollowed out core portion of the scroll wheel structure; and
   the EPM switch having a first polarity for repelling the scroll wheel permanent magnet to urge the scroll wheel permanent magnet towards the teeth of the scroll wheel metal internal gear and within the magnetic interaction distance for a haptic scrolling mode of the mouse magnetic scroll wheel device.

3. The mouse of claim 2 further comprising:
   the EPM switch having a second polarity for attracting the scroll wheel permanent magnet to urge the scroll wheel permanent magnet away from the teeth of the scroll wheel metal internal gear and outside of the magnetic interaction distance for a freespin scrolling mode of the mouse magnetic scroll wheel device.

4. The mouse of claim 1 further comprising:
   the scroll wheel permanent magnet operatively coupled to the EPM switch disposed in the hollowed out core portion of the scroll wheel structure, where the scroll wheel permanent magnet is slideable relative to the EPM switch; and
   the mouse PMU providing a pulse of voltage to the EPM switch to switch between a first polarity for repelling the scroll wheel permanent magnet to urge the scroll wheel permanent magnet towards the teeth of the scroll wheel metal internal gear and a second polarity for attracting the scroll wheel permanent magnet to urge the scroll wheel permanent magnet away from the teeth of the scroll wheel metal internal gear to switch between a haptic scrolling mode and a freespin scrolling mode of the mouse magnetic scroll wheel device due to distance of the scroll wheel permanent magnet from the teeth of the scroll wheel metal internal gear.

5. The mouse of claim 4, wherein the mouse microcontroller automatically generates a command to the mouse PMU to switch polarity of the EPM switch for selection between the haptic scrolling mode and the freespin scrolling mode based on detected speed of rotation of the scroll wheel.

6. The mouse of claim 1 further comprising:
the scroll wheel permanent magnet operatively coupled to the EPM switch disposed in the hollowed out core portion of the scroll wheel structure, where the scroll wheel permanent magnet is slideable relative to the EPM switch and moved toward or away from the teeth of the scroll wheel metal internal gear based on the polarity of the EPM switch to engage or disengage a haptic scrolling mode.

7. The mouse of claim 6 further comprising:
the mouse microcontroller to detect a rotation speed of the scroll wheel via the encoder, and when the rotation speed is below a threshold rotation speed, the mouse microcontroller cause the EPM switch to have a first polarity to slide the scroll wheel permanent magnet toward the teeth of the scroll wheel internal metal gear to engage haptic scrolling mode; and
the mouse microcontroller to detect that the rotation speed is below the threshold rotation speed and the mouse microcontroller cause the EPM switch to have a second polarity to slide the scroll wheel permanent magnet away from the teeth of the scroll wheel internal metal gear to disengage haptic scrolling mode for freespin operation of the mouse magnetic scroll wheel device.

8. The mouse of claim 6 further comprising:
the mouse microcontroller to pulse voltage from the mouse PMU to the EPM switch to switch between a first polarity to repel the scroll wheel permanent magnet and a second polarity to attract the scroll wheel permanent magnet.

9. A mouse magnetic scroll wheel device for a mouse operatively couplable to an information handling system comprising:
a mouse microcontroller;
a mouse power management unit (PMU) to provide power to the mouse microcontroller and an encoder for the mouse magnetic scroll wheel device;
the mouse magnetic scroll wheel device having a scroll wheel with a scroll wheel outer surface, an axle, and a hollowed out core portion of a scroll wheel structure, where the axle is operatively coupled to the encoder to record scrolling input from a user;
a cradle to receive the axle of the scroll wheel such that the scroll wheel is rotatable in the cradle;
a scroll wheel metal internal gear formed into an outer rim of the hollowed out core portion of the scroll wheel structure with teeth disposed towards the axle; and
a scroll wheel permanent magnet operatively coupled to an EPM switch disposed in the hollowed out core portion of the scroll wheel structure, where the scroll wheel permanent magnet is slideable relative to the EPM switch and moved toward or away from the teeth of the scroll wheel metal internal gear based on the polarity of the EPM switch to engage or disengage a haptic scrolling mode.

10. The mouse magnetic scroll wheel device of claim 9 further comprising:
the EPM switch having a first polarity for repelling the scroll wheel permanent magnet to urge the scroll wheel permanent magnet towards the teeth of the scroll wheel metal internal gear and within a magnetic interaction distance for engaging the haptic scrolling mode of the mouse magnetic scroll wheel device.

11. The mouse magnetic scroll wheel device of claim 9 further comprising:
the EPM switch having a second polarity for attracting the scroll wheel permanent magnet to urge the scroll wheel permanent magnet away from the teeth of the scroll wheel metal internal gear and outside of a magnetic interaction distance for disengaging the haptic scrolling mode and entering a freespin scrolling mode of the mouse magnetic scroll wheel device.

12. The mouse magnetic scroll wheel device of claim 9 further comprising:
the scroll wheel permanent magnet having a structural extension such that an end of the structural extension of the scroll wheel permanent magnet magnetically interacts with the teeth of the scroll wheel metal internal gear as they pass during rotation of the scroll wheel to generate scrolling haptic feedback in the haptic scrolling mode.

13. The mouse magnetic scroll wheel device of claim 9, wherein the mouse microcontroller generates a command to the mouse PMU to provide a pulse of voltage to switch polarity of the EPM switch for selection between engaging or disengaging the haptic scrolling mode.

14. The mouse magnetic scroll wheel device of claim 9 further comprising:
the mouse PMU providing a pulse of voltage to the EPM switch to switch between a first polarity for repelling the scroll wheel permanent magnet to urge the scroll wheel permanent magnet towards the teeth of the scroll wheel metal internal gear and a second polarity for attracting the scroll wheel permanent magnet to urge the scroll wheel permanent magnet away from the teeth of the scroll wheel metal internal gear to switch between engaging and disengaging the haptic scrolling mode.

15. The mouse magnetic scroll wheel device of claim 9 further comprising:
the mouse microcontroller to detect a rotation speed of the scroll wheel via the encoder;
the mouse microcontroller to automatically switch the EPM switch, via a mouse PMU pulse, to a first polarity to engage the haptic scrolling mode when the rotation speed falls below a threshold rotation speed; and
the mouse microcontroller to automatically switch the EPM switch, via the mouse PMU pulse, to a second polarity to disengage the haptic scrolling mode when the rotation speed exceeds the threshold rotation speed.

16. A mouse having a mouse magnetic scroll wheel device operatively couplable to an information handling system comprising:
a mouse microcontroller;
a mouse power management unit (PMU) to provide power to the mouse microcontroller and an encoder for the mouse magnetic scroll wheel device;
the mouse magnetic scroll wheel device having a scroll wheel with a scroll wheel outer surface, an axle, and a hollowed out core portion of a scroll wheel structure, where the axle operatively coupled to the encoder to record scrolling input from a user;
a cradle to receive the axle of the scroll wheel such that the scroll wheel is rotatable in the cradle;
a scroll wheel permanent magnet and a scroll wheel metal gear disposed in the hollowed out core portion of the scroll wheel structure to rotate with rotation of the scroll wheel, where the scroll wheel permanent magnet magnetizes the scroll wheel metal gear; and
a cradle gear holder to hold a cradle metal gear mounted around the axle to hold teeth of the cradle metal gear via use of cradle gear holder fingers that extend away from a circumference side surface of the cradle gear holder to hold the cradle metal gear next to rotation of the scroll wheel metal gear within the hollowed out core portion of the scroll wheel structure, where alignment of scroll wheel metal gear teeth of the scroll wheel metal gear with cradle metal gear teeth of the cradle metal gear increases a magnetic attraction between the scroll wheel metal gear and cradle metal gear and misalignment of the scroll wheel metal gear teeth and the cradle metal gear teeth reduces the magnetic attraction to generate a haptic feedback during scrolling with the scroll wheel.

17. The mouse of claim 16 further comprising:
a notch or ridge on the cradle gear holder to interface with a housing of the cradle to hold the cradle gear holder and the cradle metal gear from rotating with the axle of the scroll wheel.

18. The mouse of claim 16 further comprising:
a gap between the scroll wheel metal gear and the cradle metal gear to enable magnetic interaction but not contact for rotation of the scroll wheel metal gear during operation of the scroll wheel.

19. The mouse of claim 16 further comprising:
the cradle gear holder is made of a non-ferromagnetic material and having the cradle gear holder fingers between the cradle metal gear teeth to hold the cradle metal gear from rotating with the axle of the scroll wheel and reduce magnetic interaction when the scroll wheel metal gear teeth are misaligned with the cradle metal gear teeth during scroll wheel rotation.

20. The mouse of claim 16, wherein the axle of the mouse magnetic scroll wheel device is operatively coupled to a rotating Hall sensor magnet that rotates within a Hall sensor of the encoder to detect scrolling input from a user.

\* \* \* \* \*